(12) United States Patent
Sugioka et al.

(10) Patent No.: US 7,601,775 B2
(45) Date of Patent: *Oct. 13, 2009

(54) FIRE RETARDANT RESIN COMPOSITION, METHOD OF ITS PRODUCTION, SHAPED ARTICLES COMPRISING THE SAME, AND SILICA

(75) Inventors: Takuo Sugioka, Osaka (JP); Naoko Hirano, Hyogo (JP)

(73) Assignee: Nippon Shokubai Co., Ltd., Osaka-Shi (JP)

( * ) Notice: Subject to any disclaimer, the term of this patent is extended or adjusted under 35 U.S.C. 154(b) by 639 days.

This patent is subject to a terminal disclaimer.

(21) Appl. No.: 10/516,695

(22) PCT Filed: May 19, 2003

(86) PCT No.: PCT/JP03/06176

§ 371 (c)(1),
(2), (4) Date: Jan. 6, 2005

(87) PCT Pub. No.: WO03/099934

PCT Pub. Date: Dec. 4, 2003

(65) Prior Publication Data

US 2006/0167164 A1  Jul. 27, 2006

(30) Foreign Application Priority Data

May 24, 2002  (JP)  ............................. 2002-151271

(51) Int. Cl.
*C08K 3/36* (2006.01)
*C08K 7/08* (2006.01)
*C08K 7/24* (2006.01)

(52) U.S. Cl. .................. 524/492; 524/493; 524/494; 524/841; 524/301; 524/307; 524/406; 524/408; 524/409; 524/413; 524/430; 524/431; 524/432; 524/433; 524/434; 524/435; 524/436; 524/437; 252/609

(58) Field of Classification Search ................. 524/492, 524/493
See application file for complete search history.

(56) References Cited

U.S. PATENT DOCUMENTS 5,166,228 A * 11/1992 Shiobara et al. ............. 523/443
5,177,157 A * 1/1993 Akamatsu .................... 525/398

(Continued)

FOREIGN PATENT DOCUMENTS

JP  63-238129  10/1988

(Continued)

*Primary Examiner*—Joseph D Anthony
(74) *Attorney, Agent, or Firm*—Connolly Bove Lodge & Hutz LLP

(57) ABSTRACT

The present invention has for its object to provide a fire retardant resin composition which is not only halogen-free and, hence, eliminating the adverse effect to the environment and human physiology but also reflecting an excellent fire retardancy imparted to a polyphenol having inherently favorable physical properties and heat resistance.

The present invention is a fire retardant resin composition comprising a polyphenol compound and an inorganic microfine particle, wherein said polyphenol compound has such a structure that aromatic units each having at least one phenolic hydroxyl group are connected to one another through an organic unit containing two or more carbon atoms, and said inorganic microfine particle is a product of hydrolysis and condensation of an alkoxide compound and/or a carboxylic acid salt compound.

20 Claims, 3 Drawing Sheets

U.S. PATENT DOCUMENTS

| | | | |
|---|---|---|---|
| 5,418,266 A * | 5/1995 | Shiobara et al. | 523/443 |
| 5,834,551 A * | 11/1998 | Haraguchi et al. | 524/492 |
| 6,265,066 B1 * | 7/2001 | Suzuki et al. | 428/391 |
| 6,337,363 B1 | 1/2002 | Lee et al. | |
| 6,392,003 B1 | 5/2002 | Kiuchi et al. | |
| 6,441,106 B1 * | 8/2002 | Goda et al. | 525/487 |
| 2003/0031880 A1 * | 2/2003 | Aiba et al. | 428/447 |
| 2004/0046632 A1 * | 3/2004 | Kumano et al. | 336/233 |
| 2006/0223971 A1 * | 10/2006 | Yang et al. | 528/125 |

FOREIGN PATENT DOCUMENTS

| | | |
|---|---|---|
| JP | 8-208948 | 8/1996 |
| JP | 9-208839 A | 8/1997 |
| JP | 9-216938 A | 8/1997 |
| JP | 10-036686 A | 2/1998 |
| JP | 11-92623 A | 4/1999 |
| JP | 2000-313614 A | 11/2000 |
| JP | 2000-344861 | 12/2000 |
| JP | 2000-351822 | 12/2000 |
| JP | 2002-20588 A | 1/2002 |

* cited by examiner

FIRE RETARDANT RESIN COMPOSITION, METHOD OF ITS PRODUCTION, SHAPED ARTICLES COMPRISING THE SAME, AND SILICA

TECHNICAL FIELD

The present invention relates to a fire retardant resin composition, a method of producing the fire retardant resin composition, a curable composition containing the fire retardant resin composition, a shaped article thereof, and silica.

BACKGROUND ART

Polyphenols are thermosetting and their cured formulation exhibit excellent physical characteristics and heat resistance, thus polyphenols are regarded as important industrial materials, which are utilized to molding materials, raw materials for inks, paints, varnishes, adhesives, etc., raw materials for epoxy resins, curing agents, etc. By taking advantage of their characteristically high electrical insulation properties, polyphenols also exhibit remarkable electrical insulating properties, so that they have been favorably used for composite electronic materials such as printed circuit boards, semiconductor encapsulating materials, inks, paints, varnishes, and adhesives as materials of the electronic field.

In those fields where polyphenols are applied, high fire retardancy should be required. For example, materials obtained by adding 10 to 50 weight parts of a fire retardant additive, such as a brominated epoxy resin, to 100 weight parts of a polyphenol resin are in use. However, some of such halogen-containing compounds generate toxic halogen gases on incineration and the burdens and ill effects on the environment and human physiology are seriously concerned in case of incineration of used or waste products or thermal recycling by recovery of heat.

For this reason, as a fire retardation technology without using halogen-containing compounds, materials containing phosphorus-compounds are being explored. But some of such fire retardant additives detract from the mechanical properties and moisture resistance of shaped articles, not to speak of the risk for the eutrophication of the soil or natural water by phosphorus-containing pollutants from discarded products and waste materials. It is urgently needed to develop a novel fire retardation technology completely different from the concept of using a phosphorus compound, which will be halogen-free and providing for not only good fire retardancy which are required of the molding materials for electronic use, adhesives, paints and the like, but also the favorable mechanical and electrical characteristics.

Referring to the prior art, Japanese Kokai Publication Hei-9-216938 discloses a method of producing a phenolic resin-cured epoxy resin which comprises subjecting a silicon alkoxide to hydrolysis and polycondensation in a solution of a phenolic resin consisting of such a structure that aromatic units having phenolic hydroxyl groups are connected to one another through a methylene group containing one carbon atom, and using the resulting phenolic resin-silica complex as a curing agent, mixing with an epoxy resin to cure. However, since said phenolic resin-silica complex for use as the curing agent does not provide for sufficient fire retardancy, the phenolic resin-cured epoxy resin produced by this method does not have sufficient fire retardancy to replace the materials produced by using said brominated epoxy resin, said phosphorus compound or other fire retardant additive. Thus, further technical sophistication was deeply desired in this respect.

Japanese Kokai Publication Hei-11-92623 discloses a method of producing a phenolic resin-silica complex which comprises subjecting a silicon alkoxide to hydrolysis and polycondensation in a molten phenolic resin. However, this complex cannot contribute to expression of sufficient fire retardancy, either, with the result that further technical sophistication should be developed to provide polyphenol compounds with fire retardancy as good as enabling production of halogen-free compositions.

Meanwhile, as a fire retardation technology, Japanese Kokai Publication Hei-10-36686 discloses that a resin composition comprising a resin and the condensation product of a defined metal alkoxide as main components has certain favorable characteristics such as heat resistance. However, further technical sophistication must be also studied to impart sufficient fire retardancy to electronic materials, for instance. Furthermore, Japanese Kokai Publication 2000-313614 discloses a technology relating to the hydrothermal treatment of the amorphous silica having a surface area smaller than 30 $m^2/g$ and a unimodal pore diameter distribution within the size range of 30 to 2,500 nanometers, and as estimated by the nuclear magnetic resonance signal, containing at least 10% of $Q^3$ silanols and less than 0.5% of $Q^2$ silanols. However, these amorphous silica must be also more improved to provide sufficient fire retardancy. Moreover, the preparation of hydrothermally-treated silica samples in the best mode invariably involve an alkali treatment and, therefore, some technological innovation is also needed to apply this technology without any problems in the field of electronic and other materials where liabilities are affected by alkalies. Furthermore, Japanese Kokai Publication Hei-9-208839 discloses a thermosetting resin composition comprising (A) a thermosetting resin, (B) an organopolysiloxane having functional groups reactive with silanol groups, (C) a silicon alkoxide, (D) a catalyst for the reaction of water with the silicon alkoxide, and (E) an organic solvent. However, even this thermosetting resin composition must be more improved in order that it may express sufficient fire retardancy with certainty.

SUMMARY OF THE INVENTION

In view of the above state of the art, the present invention has for its object to provide a fire retardant resin composition which is not only halogen-free and, hence, eliminating the adverse effect to the environment and human physiology but also reflecting a high degree of fire retardancy imparted to a polyphenol having inherently favorable physical properties and heat resistance.

The inventors of the present invention conducted an intensive research to establish a technology for more effective fire retardation of polyphenols and, inspired by the usefulness of a resin composition comprising a polyphenol compound having a defined structure and a defined inorganic microfine particle. Ultimately they found that the fire retardancy of the cured article is enhanced due to the structural feature such that aromatic units each having at least one phenolic hydroxyl group are connected to one another with an intervening organic unit containing two or more carbon atoms. They also found that the inorganic microfine particle is a product of hydrolysis and condensation of an alkoxide compound and/or a carboxylic acid salt compound, particularly a product obtainable by conducting hydrolysis and condensation reactions in a solution containing either the reactant material for a polyphenol compound or the polyphenol compound as such, which exhibit uniform dispersion of the inorganic microfine particle in the resin composition and excellent fire retardancy of the cured article. A synergistic effect of these improvement induce that the cured article could exhibit sufficient fire retardancy for molding materials for electrical uses, inks, paints, varnishes, adhesives, etc. without addition of the conventional fire retardant additive. It was also found that a defined compound, such as an ether, is further included in the formulation, which results very suitable composition for inks, paints and varnishes. The present invention has been accordingly developed.

The inventors further explored into the methodology for evaluating the potential of substances to impart fire retardancy to resins for use in the development of highly fire retardant resin compositions and with their attention directed to the fire retardancy-imparting ability of silica on resins, and they found that microstructure of silica will cause formation of $H_2O$ by dehydrative condensation of silanol groups at high temperature, and that the concentration of organic leaving groups on the surface and interiorly of silica can influence the efficiency of fire retardancy-imparting ability to be applicable in the field of electronic components. The inventors arrived at the investigation that a sufficient fire retardancy-imparting ability can be insured with certainty by evaluating the exotherm obtained by the differential scanning calorimetry and/or differential thermal analysis of silica under defined conditions in combination with the integral intensity ratio $A_{Q3}/A_{Q4}$ obtained by $^{29}Si$-DD/MAS-NMR spectrometry. In this connection, $A_{Q3}$ of said integral intensity ratio $A_{Q3}/A_{Q4}$ represents the peak area value of the $Q^3$ silica component whose number of $SiO_4$ groups adjacent to a silicon atom is 3 and $A_{Q4}$ represents the peak area value of the $Q^4$ silica component whose number of $SiO_4$ groups adjacent to a silicon atom is 4. $A_{Q3}/A_{Q4}$ is the value calculated from the respective integrated peak areas obtained by waveform separation of respective peaks. The inventors further found that a silica having a good fire retardancy-imparting ability as judged by the above evaluation method and a highly fire-retardant resin composition containing such a silica is useful for the fire retardation technology without employing any halogen-containing compound. The present invention is based on the above investigation.

The present invention, therefore, relates to a fire retardant resin composition comprising a polyphenol compound and an inorganic microfine particle, wherein said polyphenol compound has such a structure that aromatic units each having at least one phenolic hydroxyl group are connected to one another with an organic unit containing two or more carbon atoms, and said inorganic microfine particle is a product of hydrolysis and condensation of an alkoxide compound and/or a carboxylic acid salt compound.

The present invention further relates to a silica which has not more than 3.0 cal/g of exotherm per unit mass thereof as found by differential scanning calorimetry and/or differential thermal analysis in an air stream at 100° C. to 400° C., and has not less than 0.001 nor more than 2.0 of integral intensity ratio $A_{Q3}/A_{Q4}$ obtainable by splitting a peak situated in the range of −120 to −80 ppm in $^{29}Si$-DD/MAS-NMR spectrometry into a $Q^3$ silica component and a $Q^4$ silica component.

DISCLOSURE OF THE INVENTION

The present invention is now described in detail.

The fire retardant resin composition according to the present invention finds application as a molding material for electronic materials or a raw material for inks, paints, varnishes, adhesives, etc. and comprises a polyphenol compound and an inorganic microfine particle, which has sufficient fire retardancy for such applications. The above polyphenol compound has a structure such that aromatic units each having at least one phenolic hydroxyl group are connected to one another with an organic unit containing two or more carbon atoms.

Referring to the above polyphenol compound, the aromatic unit means an aromatic ring having at least one phenolic hydroxyl group. This aromatic unit is a moiety having a phenol or equivalent structure and, such as phenol, hydroquinone, naphthol, anthracenol, bisphenol, and biphenyl, etc. are preferred. The most preferred, among these, is the phenol structure. The moiety having such a phenol or equivalent structure may be appropriately substituted by alkyl, alkylene, aralkyl, phenyl, phenylene, and the similar groups.

Referring, further, to the above polyphenol compound, the organic unit means a moiety essentially containing carbon and connecting to the constituent aromatic units of the polyphenol compound. The organic unit having two or more carbon atoms preferably has a cyclic structure. The cyclic structure means a structure containing a ring such as an aliphatic ring or an aromatic ring, for instance, and the preferred ring includes a cyclopentane ring, a cyclohexane ring, a benzene ring, a naphthalene ring, and an anthracene ring. Moreover, the organic structure preferably has a nitrogen-containing ring structure, such as a triazine ring or a phosphazene ring, and/or an aromatic ring, particularly preferably has a triazine ring and/or an aromatic ring.

The polyphenol compound may have other aromatic units and organic structures in addition to the those mentioned above, and may further additionally have a structure such that aromatic units each having at least one phenolic hydroxyl group are connected to one another with an organic unit containing one carbon atom (methylene).

In the case where the polypehnol compound mentioned above has a nitrogen-containing ring structure as said organic unit, the nitrogen content is preferably 1 to 50 mass %. If it is less than 1 mass %, molding materials for electronic components, adhesives, paints, etc. may possibly be deficient in fire retardancy and, if it exceeds 50 mass %, it may happen that physical properties cannot be well reconciled with fire retardancy. The more preferred range is 3 to 30 mass % and the still more preferred range is 5 to 20 mass %. The nitrogen content referred to above is the percentage by mass of the constituent atomic nitrogen of the polyphenol compound, with the total mass of the polyphenol compound being taken as 100 mass %.

The polyphenol compound used in the invention is preferably the compound produced from the reactant material essentially comprising a compound for constructing an aromatic unit having at least one phenolic hydroxyl group (hereinafter referred to sometimes as an aromatic unit-constructing compound) and a compound for constructing an organic unit containing two or more carbon atoms (hereinafter referred to sometimes as an organic unit-constructing compound).

The reactant material referred to above means a mixture essentially comprising an aromatic unit-constructing compound and an organic unit-constructing compound, optionally containing other compounds where necessary, as well as a solvent and/or the similar which may be required for carrying out the reaction. As said aromatic unit-constructing compound and organic unit-constructing compound, either one or two or more species can respectively be used.

The aromatic unit-constructing compound referred to above may be any compound having either one or two or more phenolic hydroxyl groups attached to an aromatic ring and may additionally have either one or two or more substituent groups other than hydroxyl.

The preferred species of said aromatic unit-constructing compound includes phenol, o-cresol, m-cresol, p-cresol, o-ethylphenol, p-ethylphenol, a mixture of cresols, p-hydroxyethylphenol, p-n-propylphenol, o-isopropylphenol, p-isopropylphenol, a mixture of isopropylphenols, o-sec-butylphenol, m-tert-butylphenol, p-tert-butylphenol, pentylphenol, p-octylphenol, p-nonylphenol, 2,3-dimethylphenol, 2,4-dimethylphenol, 2,6-dimethylphenol, 3,4-dimethylphenol, 2,4-di-sec-butylphenol, 3,5-dimethylphenol, 2,6-di-sec-butylphenol, 2,6-di-tert-butylphenol, 3-methyl-4-isopropylphenol, 3-methyl-5-isopropylphenol, 3-methyl-6-isopropylphenol, 2-tert-butyl-4-methylphenol, 3-methyl-6-tert-butylphenol, 2-tert-butyl-4-ethylphenol, etc. The preferred species of said compound having two or more phenolic hydroxyl groups include catechol, resorcine, biphenol, bisphenol A, bisphenol S, bisphenol F, etc., and compounds for constructing polycyclic aromatic units, such as α-naphthol, β-naphthol, etc., can also be used with advantage.

The preferred species of said organic unit-constructing compound include (1) aromatic compounds having any of α-hydroxyalkyl, α-alkoxyalkyl, and α-acetoxyalkyl groups, (2) unsaturated bond-containing compounds, (3) carbonyl group-containing compounds, such as aldehydes and ketones, (4) compounds having two or more kinds of said specific active groups or active sites, and (5) compounds having any of amino, hydroxyalkylamino, and di(hydroxyalkyl)amino groups.

As the (1) aromatic compounds referred to above, the following compounds are preferred: p-xylylene glycol, p-xylylene glycol dimethyl ether, p-diacetoxymethylbenzene, m-xylylene glycol, m-xylylene glycol dimethyl ether, m-diacetoxymethylbenzene, p-dihydroxyisopropylbenzene, p-dimethoxyisopropylbenzene, p-diacetoxyisopropylbenzene, trihydroxymethylbenzene, trihydroxyisopropylbenzene, trimethoxymethylbenzene, trimethoxyisopropylbenzene, 4,4'-dihydroxymethylbiphenyl, 4,4'-dimethoxymethylbiphenyl, 4,4'-diacetoxymethylbiphenyl, 3,3'-dihydroxymethylbiphenyl, 3,3'-dimethoxymethylbiphenyl, 3,3'-diacetoxymehylbiphenyl, 4,4'-dihydroxyisopropylbiphenyl, 4,4'-dimethoxyisopropylbiphenyl, 4,4'-diacetoxyisopropylbiphenyl, 3,3'-dihydroxyisopropylbiphenyl, 3,3'-dimethoxyisopropylbiphenyl, 3,3'-diacetoxyisopropylbiphenyl, 2,5-dihydroxymethylnaphthalene, 2,5-dimethoxymethylnaphthalene, 2,5-diacetoxymethylnaphthalene, 2,6-dihydroxymethylnaphthalene, 2,6-dimethoxymethylnaphthalene, 2,6-diacetoxymethylnaphalene, 2,5-dihydroxyisopropylnaphthalene, 2,5-dimethoxyisopropylnaphthalene, 2,5-diacetoxyisopropylnaphthalnene, 2,6-dihydroxyisopropylnaphthalene, 2,6-dimethoxyisopropylnaphthalene, 2,6-diacetoxyisopropylnaphthalene, etc.

As the (2) unsaturated bond-containing compounds referred to above, divinylbenzene, diisopropenylbenzene, trivinylbenzene, triisopropenylbenzene, dicyclopentadiene, norbornene, terpenes, etc. are preferred.

As the (3) carbonyl group-containing compounds referred to above, various aldehydes and ketones containing 5 to 15 carbon atoms are suitable and more particularly, benzaldehyde, octanal, cyclohexanone, acetophenone, hydroxybenzaldehyde, hydroxyacetophenone, crotonaldehyde, cinnamaldehyde, glyoxal, glutaraldehyde, terephthalaldehyde, cyclohexanedicarbaldehyde, tricyclodecanedicarbaldehyde, norbornanedicarbaldehyde, suberaldehyde, etc. are preferred.

Referring to the (4) compounds having two or more kinds of specific active groups or active sites, the preferred compounds having a carbonyl group and an unsaturated bond include isopropenylbenzaldehyde, isopropenylacetophenone, citronellal, citral, perillaldehyde, etc.

The preferred compound having an α-hydroxyalkyl or α-alkoxyalkyl group and an unsaturated bond includes dihydroxymethylstyrene, dihydroxymethyl-α-methylstyrene, dimethoxymethylstyrene, dimethoxymethyl-α-methylstyrene, hydroxymethyldivinylbenzene, hydroxymethyldiisopropylbenzene, methoxymethyldivinylbenzene, methoxymethyldiisopropylbenzene, etc.

The preferred species of said (5) compounds having any of amino, hydroxyalkylamino, and di(hydroxyalkyl)amino groups include melamine, dihydroxymethylmelamine, trihydroxymethylmelamine, acetoguanamine, dihydroxymethylacetoguanamine, tetrahydroxymethylacetoguanamine, benzoguanamine, dihydroxymethylbenzoguanamine, tetrahydroxymethylbenzoguanamine, urea, dihydroxymethylurea, tetrahydroxymethylurea, ethylenediamine, dihydroxymethylethylenediamine, tetrahydroxymethylethylenediamine, hexaethylenediamine, dihydroxymethylhexaethylenediamine, tetrahydroxymethylhexaethylenediamine, p-xylylenediamine, p-dihydroxymethylaminobenzene, m-xylylenediamine, m-dihydroxymethylaminobenzene, 4,4'-oxydianiline, 4,4'-oxydihydroxymethylaniline, 4,4'-methylenedianiline, 4,4'-methylenedihydroxymethylaniline, etc. Among these, compounds having a triazine moiety such as melamine, benzoguanamine, acetoguanamine, etc., are preferred.

The reactant material mentioned above preferably comprises an aromatic unit-constructing compound (hereinafter referred to sometimes as starting compound A) and a compound capable of forming at least one of the above-mentioned organic structures (1) to (5) (hereinafter referred to sometimes as starting compound B) as essential components. More preferably, the reactant material essentially comprises the starting compound A, a compound capable of forming at least one of said organic units (1) to (4) (hereinafter referred to sometimes as starting compound B1), and a compound capable of forming said organic unit (5) (hereinafter referred to sometimes as starting compound B2). Regarding the sequence of reacting these starting compounds in the above instance, it is preferable to mix, in advance, the starting compound A, starting compound B1 and starting compound B2 before starting the reaction and ensure that starting compound B2 will be reacted before completion of the reaction between the starting compound A and starting compound B1 and, for example, it is preferable to react the starting compound A, starting compound B1 and starting compound B2 concurrently or react the starting compound A with starting compound B2 in a first stage and followed by reacting the starting compound B1 in a second stage. This protocol leads to a more positive enhancement of fire retardancy and the reaction product can be applied with advantage to molding materials for electronic components, adhesives, and paints, for instance. More preferably, the starting compound A is reacted with starting compound B2 in a first stage and starting compound B1 is further reacted in a second stage.

The formulating molar ratio of the starting compound A to starting compound B utilized for the production of said polyphenol compound is preferably not less than 1/1 nor more than 10/1. If the proportion of the starting compound A is smaller than 1/1, gelation may take place in the course of production of the fire retardant resin composition according to the invention, and if the proportion of the starting compound A exceeds 10/1, the resin composition may possibly be hardly expressing fire retardancy. The more preferred ratio, in terms of enhancement ability of the fire retardant resin composition at elevated temperature, is not less than 1.3/1 nor more than 8/1, and the still more preferred ratio is not less than 1.8/1 nor more than 5/1.

The above polyphenol compound is preferably obtained by reacting said reactant material in presence of a catalyst. The catalyst for the production of a polyphenol compound may be any substance capable of accelerating the reaction of said reactive material.

The catalysts suitable for reacting the starting compound B1 preferably include acid catalysts such as inorganic acids, e.g. hydrochloric acid, sulfuric acid, phosphoric acid etc., organic sulfonic acid, e.g. p-toluenesulfonic acid, methanesulfonic acid, etc., superstrong acids such as boron trifluoride or its complex, trifluoromethanesulfonic acid, heteropolyacids, etc., and solid acid catalysts such as activated clay, synthetic zeolite, sulfonic acid series ion exchange resins, perfluoroalkanesulfonic acid series ion exchange resins, etc.

The added amount of catalyst for reacting said starting compound B1 appropriately depends on the acid strength of each catalyst, though it preferably adjusts 0.001 to 100 mass % with respect to the starting compound B1. As the catalyst giving a homogeneous system within this range, trifluoromethanesulfonic acid, methanesulfonic acid, boron trifluoride, etc. are preferred and the preferable added amount of these catalysts is 0.001 to 5 mass %. The added amount of heterogeneous catalysts such as ion exchange resins, active clay, etc. is preferably 1 to 100 mass %.

Referring to the catalyst for reacting the starting compound B2, the basic catalyst which can be used with advantage includes alkali metal or alkaline earth metal hydroxides, such as sodium hydroxide, potassium hydroxide, barium hydroxide, etc., the corresponding oxides, ammonia, primary to tertiary amines, hexamethylenetetramine, sodium carbonate, etc. and the acid catalysts which can be used with advantage include inorganic acids, such as hydrochloric acid, sulfuric acid, sulfonic acid, etc.; organic acids, such as oxalic acid, acetic acid, etc.; Lewis acids; and divalent metal salts such as zinc acetate. When the fire retardant resin composition is used as an epoxy resin curing agent for electrical/electronic application, it is preferable to use an amine as the basic catalyst or an organic acid as the acid catalyst, since residues of inorganic matter such as metal is not preferable.

Where necessary, after the reaction of the starting compound B2 is completed, impurities such as salts are preferably removed by neutralization and/or washing with water. However, when an amine compound is used as the catalyst, neutralization and washing for removing impurities are preferably refrained.

While the polyphenol compound is to be formed on condensation of the aromatic ring of starting compound A with the substituent group of the starting compound B, the reaction entails by-production of a carboxylic acid, an alcohol, water, etc. accompanying formation of the polyphenol compound. The carboxylic acid, alcohol and water thus formed as byproducts can be easily removed from the reaction product by distillation under reduced pressure during or after the reaction or by azeotropic distillation with a solvent, without any complicated procedure. The reaction product in the present context means a mixture containing all products formed in the reaction, thus including the polyphenol compound, the byproduct such as carboxylic acid, alcohol and water, the catalyst used optionally, and the solvent described hereinafter.

Referring to the reaction conditions in the production of said polyphenol compound, the reaction temperature is preferably adjusted so that byproduct carboxylic acid, alcohol and water are vaporized or distilled off, namely 100 to 240° C. The reaction temperature is more preferably 110 to 180° C., still more preferably 130 to 160° C. Thus, production of the polyphenol compound involves by-production of a carboxylic acid and others but the byproducts can be easily removed from the reaction product. Depending on characteristics and added amount of starting materials, catalyst, or reaction temperature, etc., the reaction time is preferably adjusted so that the reaction between the starting compound A and starting compound B is substantially completed, that is to say, the carboxylic acid, alcohol and water cease to form, thus being 30 minutes to 24 hours. The more preferred reaction time is 1 to 12 hours.

Referring to the reaction technology used for the production of said polyphenol compound, the reaction can be proceeded in presence of a solvent which is preferably inert to the reaction between the starting compound A and starting compound B. Thus, toluene, xylene, monochlorobenzene, or dichlorobenzene, for instance, can be used. By using a solvent, the starting compound can be dissolved therein to give a homogeneous system. In reacting the starting compound B1, the reaction preferably takes place in absence of a solvent.

In the production of said polyphenol compound, the removal of byproducts, such as carboxylic acid, alcohol and water, and the solvent from the reaction product is preferably carried out by distillation under a reduced pressure of 0.1 to 10 kPa at the above-mentioned temperature. Since the unreacted phenolic compound may also be concomitantly distilled off, the distillation procedure is preferably carried out after substantial completion of the reaction.

The inorganic microfine particle according to the invention is the product of hydrolysis and condensation of an alkoxide compound and/or a carboxylic acid salt compound. This inorganic microfine particle is preferably the product of hydrolysis and condensation obtained by the sol-gel method. More preferably, it is the product of hydrolysis and condensation of an alkoxide compound as obtained by the sol-gel method.

The product of hydrolysis and condensation mentioned above is the compound obtained by a hydrolysis reaction and a subsequent condensation reaction.

The hydrolysis reaction and condensation reaction of an alkoxide compound or a carboxylic acid salt compound can be written as follows:

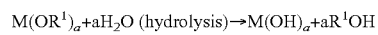

$M(OR^1)_a + aH_2O$ (hydrolysis) $\rightarrow M(OH)_a + aR^1OH$

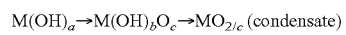

$M(OH)_a \rightarrow M(OH)_b O_c \rightarrow MO_{2/c}$ (condensate)

(wherein M represents a metal element; $R^1$ represents an alkyl group or an acyl group; and a, b, and c each represents an arbitrary number).

As said alkoxide compound and/or carboxylic acid salt compound, a compound represented by the following general formula (1):

$$M(OR^2)_n \qquad (1)$$

(wherein M represents a metal element; $R^2$ represents an alkyl group or an acyl group; and n represents an integer of 1 to 7) and/or a compound represented by the following general formula (2):

$$(R^3)_m M(OR^2)_p \qquad (2)$$

(wherein M and $R^2$ respectively have the same meanings as defined in general formula (1); $R^3$ represents an organic group; and m and p each represents an integer of 1 to 6) can be used with advantage.

The alkyl group as $R^2$ in the above general formulas (1) and (2) is preferably an alkyl group of 1 to 5 carbon atoms, thus including ethyl, n-propyl, i-propyl, n-butyl, i-butyl, sec-butyl, tert-butyl, n-pentyl, etc. The acyl group as $R^2$ is preferably an acyl group of 1 to 4 carbon atoms, thus including acetyl, propionyl, butynyl, etc.

The organic group as $R^3$ in the above general formula (2) is preferably an organic group containing 1 to 8 carbon atoms, thus including alkyl groups such as methyl, n-propyl, i-propyl, n-butyl, i-butyl, sec-butyl, tert-butyl, n-pentyl, n-hexyl, n-heptyl, n-octyl, etc.; halogenated alkyl groups such as 3-fluoropropyl, 3-chloropropyl, 3,3,3-trichloropropyl, etc.; mercapto group-containing alkyl groups such as 2-mercaptopropyl; amino group-containing alkyl groups such as 2-aminoethyl, 2-dimethylaminoethyl, 3-aminopropyl, 3-dimethylaminopropyl, etc.; aryl groups such as phenyl, methylphenyl, ethylphenyl, methoxyphenyl, ethoxyphenyl, fluorophenyl, etc.; aralkyl groups such as benzyl etc.; epoxy group-containing organic groups such as 2-glycidoxyethyl, 3-glycidoxypropyl, 2-(3,4-epoxycyclohexyl)ethyl,. etc.; and unsaturated group-containing organic groups such as vinyl, 3-(meth)acryloxypropyl, etc.

The metal element M in the above general formulas (1) and (2) may be any metal element in the periodic table of the elements capable of having the structures of compounds represented by the general formulas (1) and (2), but is preferably at least one metal element selected from among Group IIIB elements, e.g. B, Al, Ca, In, and Tl; Group IVB elements, e.g. C, Si, Ge, Sn, and Pb; Ti, Zr, Zn, Ca, Na, Li, Te, Mg, Ni, Cr, Ba, Ta, Mo, Tb, Cs, etc. Among these, Al, In or Si is preferred and Si is the more preferred.

The alkoxide compound and carboxylic acid salt compound containing Si as the above metal element includes tetraalkoxysilanes, such as tetramethoxysilane, tetraethoxysilane, tetra-n-propoxysilane, tetra-i-propoxysilane, tetra-n-butoxysilane, tetra-i-butoxysilane, tetra-sec-butoxysilane, tetra-tert-butoxysilane, etc.; trialkoxysilanes, such as methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-mercaptopropyltrimethoxysilane, 3-aminopropyltrimethoxysilane, 3-aminopropyltriethoxysilane, phenyltrimethoxysilane, phenyltriethoxysilane, benzyltrimethoxysilane, benzyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, 3-(meth)acryloxypropyltrimethoxysilane, 3-(meth)acryloxypropyltriethoxysilane, etc.; dialkoxysilanes, such as dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, diphenyldimethoxysilane, diphenyldiethoxysilane, etc.; tetraacyloxysilanes, such as tetraacetyloxysilane, tetrapropionyloxysilane, etc.; triacyloxysilanes, such as methyltriacetyloxysilane, ethyltriacetyloxysilane, etc.; and diacyloxysilanes, such as dimethyldiacetyloxysilane, diethyldiacetyloxysilane, etc. Among these, tetramethoxysilane, tetraethoxysilane, methyltrimethoxysilane, methyltriethoxysilane, dimethyldimethoxysilane, and dimethyldiethoxysilane are preferred. Thus, the alkoxide compound preferably contains a silicon alkoxide.

The alkoxide compound in which said metal element is other than Si preferably includes single metal alkoxides, such as $LiOCH_3$, $NaOCH_3$, $Cu(OCH_3)_2$, $Ca(OCH_3)_2$, $Sr(OC_2H_5)_2$, $Ba(OC_2H_5)_2$, $Zn(OC_2H_5)_2$, $B(OCH_3)_3$, $Al(OCH_3)_3$, $Al(OC_2H_5)_3$, $Al(iso-OC_3H_7)_3$, $Al(OC_4H_9)_3$, $Ga(OC_2H_5)_3$, $Y(OC_4H_9)_3$, $Ge(OC_2H_5)_4$, $Pb(OC_4H_9)_4$, $P(OCH_3)_3$, $Sb(OC_2H_5)_3$, $VO(OC_2H_5)_3$, $Ta(OC_3H_7)_5$, $W(OC_2H_5)_6$, $La(OC_3H_7)_3$, $Nd(OC_2H_5)_3$, $Ti(OCH_3)_4$, $Ti(OC_2H_5)_4$, $Ti(iso-OC_3H_7)_4$, $Ti(OC_4H_9)_4$, $Zr(OCH_3)_4$, $Zr(OC_2H_5)_4$, $Zr(OC_3H_7)_4$, $Zr(OC_4H_9)_4$, etc.; and complex metal alkoxides, such as $La[Al(iso-OC_3H_7)_4]_3$, $Mg[Al(iso-OC_3H_7)_4]_2$, $Mg[Al(sec-OC_4H_9)_4]_2$, $Ni[Al(iso-OC_3H_7)_4]_2$, $(C_3H_7O)_2Zr[Al(OC_3H_7)_4]_2$, $Ba[Zr(OC_2H_5)_9]_2$, etc.

Referring to the utilized amounts of said compounds of general formulas (1) and (2), in consideration of the fire retardancy of the curable fire retardant resin composition and the affinity of the obtained inorganic microfine particle for the constituent component of the curable fire retardant resin composition, the proportion of the compound of general formula (1) is preferably not less than 80 weight parts, more preferably not less than 90 weight parts, based on 100 weight parts of the total of compounds represented by general formulas (1) and (2).

In order to accelerate said hydrolysis and condensation reactions, metal chelate compounds can be used. One or two or more species of these can be used. The preferred metal chelate compound is at least one compound selected from the group consisting of $Zr(OR^4)_q(R^5COCHCOR^6)_{4-q}$, $Ti(OR^4)_r(R^5COCHCOR^6)_{4-r}$, and $Al(OR^4)_s(R^5COCHCOR^6)_{4-s}$ or a partial hydrolysate thereof.

Referring to the above metal chelate compounds, $R^4$ and $R^5$, may be the same or different, and each represents an organic group of 1 to 6 carbon atoms; $R^6$ represents an organic group of 1 to 6 carbon atoms or an alkoxyl group of 1 to 16 carbon atoms; q and r each represents an integer of 0 to 3; and s represents an integer of 0 to 2. The organic group of 1 to 6 carbon atoms for $R^4$ and $R^5$ preferably includes methyl, ethyl, n-propyl, i-propyl, n-butyl, i-butyl, sec-butyl, tert-butyl, n-pentyl, n-hexyl, phenyl, etc. The alkoxyl group of 1 to 16 carbon atoms for $R^6$ preferably includes methoxy, ethoxy, n-propoxy, i-propoxy, n-butoxy, i-butoxy, sec-butoxy, tert-butoxy, etc.

The preferred species of said metal chelate compound includes zirconium chelate compounds such as tri-n-butoxyethyl acetoacetate zirconium, di-n-butoxy bis(ethyl acetoacetate)zirconium, n-butoxy tris(ethyl acetoacetate)zirconium, tetrakis(n-propyl acetoacetate)zirconium, tetrakis(acetyl acetonato)zirconium, tetrakis(ethyl acetoacetate)zirconium, etc.; titanium chelate compounds such as di-i-propoxy bis(ethyl acetoacetate)titanium, di-i-propoxy bis(acetyl acetate)titanium, di-i-propxy bis(acetyl acetonate)titanium, etc.; and aluminum chelate compounds, such as di-i-propoxy ethyl acetylacetate aluminum, di-i-propoxy acetylacetonato-aluminum, i-propoxy bis(ethyl acetoacetate)aluminum, i-propoxy bis(acetyl acetonato)aluminum, tris(ethyl acetoacetate) aluminum, tris(acetyl acetonato)aluminum, monoacetylacetonato-bis(ethyl acetoacetate)aluminum, etc. The preferred, among these, are tri-n-butoxy ethyl acetoacetate zirconium, di-i-propoxy bis(acetyl acetonato)titanium, di-i-propoxy ethyl acetoacetate aluminum, tris(ethyl acetoacetate)aluminum.

The utilized amount of said metal chelate compound is preferably not more than 30 weight parts based on 100 weight parts of said compound of general formula (1) and/or compound of general formula (2). If it exceeds 30 weight parts, the shaped article tends to deteriorate in surface appearance.

The utilized amount is more preferably not more than 20 weight parts, still more preferably not more than 10 weight parts.

To said alkoxide compound, said carboxylic acid salt compound, or said inorganic microfine particle resulting from the hydrolysis and condensation thereof, colloidal silica and/or colloidal alumina can be added for the purpose of enhancing the rigidity of the resulting fire retardant resin composition. One or two or more species of these can be used.

The colloidal silica mentioned above is a dispersion of silicic anhydride of high purity in water and/or a hydrophilic organic solvent; its average particle diameter is 5 to 100 nm, preferably 10 to 50 nm, and its solid concentration is about 10 to 40 mass %. As colloidal silica, Snowtex, Isopropanol Silica Sol, Methanol Silica Sol (product name, all are products of Nissan Chemical Industries, Ltd.), Cataloid, Oscal (product name, both are products of Catalysts & Chemicals Industries Co., Ltd.), Ludex (product name, product of DuPont, U.S.A.), Syton (product name, product of Monsanto, U.S.A.), Nalcoag (product name, product of Nalco Chemical Co., U.S.A.), etc., can be used with advantage.

The colloidal alumina mentioned above is either an alumina sol within the range of pH 2 to 6 using water as a dispersion medium or an alumina sol using a hydrophilic organic solvent as a dispersion medium; its average particle diameter is 5 to 200 nm, preferably 10 to 100 nm, and its solid concentration is about 5 to 30 mass %. As to the alumina mentioned above, synthetic alumina, boehmite, and pseudo-boehmite are suitable. The colloidal alumina which can be used with advantage includes Alumina Sol-100, Alumina Sol-200, Alumina Sol-520 (product name, all are products of Nissan Chemical Industries, Ltd.), etc.

The formulating amount of said colloidal silica and/or colloidal alumina is preferably not more than 60 weight parts as solids based on 100 weight parts as solids of the inorganic microfine particle derived from the alkoxide compound and/or carboxylic acid salt compound. If it exceeds 60 weight parts, the shaped article tends to deteriorate in surface appearance. The preferred amount is not more than 40 weight parts.

The inorganic microfine particle according to the invention may optionally contain the hydrolysate/condensate of a hydrolyzable metal salt, and as suitable examples of the hydrolyzable metal salt, there can be mentioned copper salts such as $Cu(NO_3)_2$, $CuCl_2$, $CuSO_4$, etc.; titanium salts such as $TiCl_4$, $TiCl_2$, $TiSO_4$, etc.; yttrium salts such as $Y(NO_3)_3$, $YCl_3$, etc.; zirconium salts such as $ZrSO_4$, $ZrCl_2$, $Zr(NO_3)_2$, etc.; chromium salts such as $Cr(NO_3)_3$, $CrCl_3$, etc.; aluminum salts such as $Al(NO_3)_3$, $Al_2(SO_4)_3$, etc.; and nickel salts such as $Ni(NO_3)_2$, $NiCl_2$, etc. One or two or more species of these can be used. The hydrolysate/condensate of such a hydrolyzable metal salt may be a component of the product of hydrolysis and condensation of the alkoxide compound and/or carboxylic acid salt compound or a component constituting a mixture as particles.

Since the inorganic microfine particle according to the invention is the product of hydrolysis and condensation of an alkoxide compound and/or a carboxylic acid salt compound, it has an ultrastructure distinct from the structures of the inorganic microfine particles obtainable by other processes involving different reaction mechanisms. In cases where the inorganic microfine particle contains any of such metal elements as Si, Al, P, Fe, Ag, Sn, Ti, V, Cr, Mn, Co, Cu, Zn, Sb, La, etc., for instance, the ultrastructure can be confirmed by nuclear magnetic resonance (NMR) analysis. Taking the case in which Si is contained as an example, the fundamental structure is a regular tetrahedron formed by the $SiO_4$ cluster consisting of 4 oxygen atoms coordinated around one Si atom, and the ultrastructures generally differ depending on how $SiO_4$ clusters share the oxygen atom with the neighbour clusters. In the case where a silica is prepared by air oxidation of siliceous sand obtained by pyrolysis or thermal reduction of a silicon halide, the $SiO_4$ clusters share all of the oxygen atoms, with the result that Si-NMR analysis reveals only the $Q^4$ silica component having a peak top at −120 to −100 ppm. In contrast, in the case of the product of hydrolysis and condensation of an alkoxide compound and/or a carboxylic acid salt compound which is disclosed in this specification, some $SiO_4$ clusters exist independently from their neighbours which do not share oxygen atoms in common, so that the $Q^3$ silica component having a peak top at −100 ppm to −90 ppm is observed alongside the $Q^4$ silica component. This NMR analysis can provide a useful technique for ascertaining whether an inorganic microfine particle is the product of hydrolysis and condensation of an alkoxide compound and/or a carboxylic acid salt compound and further enables to estimate how an inorganic microfine particle can function.

As the inorganic microfine particle, it is preferable to use a silica, and particularly because of fire retardancy, which could be more preferably obtained from the hydrolysis and condensation of an alkoxide compound and/or a carboxylic acid salt compound, and has an ultrastructure such that the integral intensity ratio $A_{Q3}/A_{Q4}$ is not less than 0.001 nor more than 2.0, which is determined by splitting a peak situated in the range of −120 to −80 ppm into $Q^3$ and $Q^4$ silica components by means of $^{29}$Si-DD/MAS-NMR analysis.

The integral intensity ratio $A_{Q3}/A_{Q4}$ are as hereinafter defined referring to the silica according to the present invention.

The inorganic microfine particle mentioned above comprises discrete spherical particles and/or aggregates thereof, and the average particle diameter of said aggregates is preferably not more than 100 μm. If it exceeds 100 μm, the inorganic microfine particle cannot be uniformly dispersed in the composition so that the mechanical properties tend to be adversely affected. The more preferred particle diameter is not more than 5 μm, and the still more preferred particle diameter is not more than 2 μm. The term "discrete spherical particles" used herein means primary particles of the inorganic microfine particle and the term "aggregates" used herein means secondary particles formed de novo as the result of aggregation of the primary particles.

The fire retardant resin composition of the present invention is preferably in such a mode that an inorganic microfine particle has been dispersed in a polyphenol compound, and the technology of producing such a composition includes (1) the method which comprises producing a polyphenol compound and an inorganic microfine particle independently, followed by mixing the two, (2) the method which comprises producing a polyphenol compound in advance and conducting the hydrolysis and condensation of an alkoxide compound and/or a carboxylic acid salt compound in a solution comprising said polyphenol compound to disperse an inorganic microfine particle therein, (3) the method which comprises subjecting an alkoxide compound and/or a carboxylic acid salt compound to hydrolysis and condensation in a solution containing a reactant material for the synthesis of the polyphenol compound, followed by forming the polyphenol compound. Among these, the method (2) or (3) is preferred. Thus, the preferred method of producing the fire retardant resin composition of the invention includes a step for conducting hydrolysis and condensation of an alkoxide compound and/or a carboxylic acid salt compound in a solution containing the reactant material for the polyphenol compound and/or the polyphenol compound. It is still more preferable that said polyphenol compound has a structure such that aromatic units each having at least one phenolic hydroxyl group are connected to one another through organic units containing two or more carbon atoms. Such method of producing the fire retardant resin composition is also another aspect of the invention.

By using such a production method, complexing of the polyphenol compound and inorganic microfine particle takes place to give the fire retardant resin composition of the invention which is an organic-inorganic hybrid (complex) comprising a microscopic dispersion of an inorganic microfine particle, such as a microfine silica particle, in a matrix polyphenol compound. Thus, the obtained organic-inorganic hybride composition exhibits an excellent fire retardancy.

Referring to the above method (2) for producing a fire retardant resin composition, a polyphenol compound is first produced to prepare a solution containing the polyphenol compound, as mentioned above. Then, an alkoxide compound and/or a carboxylic acid salt compound and either water or a solvent containing water is added to the above solution to carry out hydrolysis and condensation reactions. The preferred is the sol-gel method.

The above solution containing a polyphenol compound is preferably a solution prepared by dissolving the polyphenol compound in a solvent such as an alcohol, e.g. methanol, ethanol, etc.; a ketone, e.g. acetone, 2-butanone, etc.; or a hydrophilic organic solvent e.g. tetrahydrofuran, N,N-dimethylformamide, pyridine, etc. Where necessary, other solvents may also be added.

The amount of said solvent relative to 100 weight parts of the polyphenol compound is preferably not less than 5 weight parts nor more than 500 weight parts. More preferably, it is not less than 20 weight parts nor more than 200 weight parts.

As the other solvents referred to above, methanol or ethanol, for instance, is suitable.

Referring to the conditions of hydrolysis and condensation reactions for producing the fire retardant resin composition, the reaction temperature is preferably 0 to 120° C., more preferably 20 to 80° C. The reaction time is preferably 30 minutes to 24 hours, more preferably 1 to 12 hours.

In the above method (3) of producing the fire retardant resin composition, a solution containing said aromatic unit-constructing compounds and/or organic unit-constructing compounds as the reactant materials for polyphenol compound is prepared, followed by adding said alkoxide compound and/or carboxylic acid salt compound and either water or a solvent containing water for conducting hydrolysis and condensation reactions to give a reactant material solution for polyphenol compound in which said inorganic microfine particle has been dispersed. It is preferably the sol-gel technique. Thereafter the polyphenol compound is synthesized under the conditions described above.

The utilized solvent in said solution containing the reactant material for the polyphenol compound and the utilized amount of the solvent may be the same as those mentioned for the above method (2) of producing the fire retardant resin composition and the conditions of hydrolysis and condensation may also be the same as those described hereinbefore.

In the fire retardant resin composition obtained by the above production method, the content of the inorganic microfine particle relative to 100 mass % of the fire retardant resin composition is preferably not less than 3 mass % nor more than 80 mass %. If it is less than 3 mass %, an acceptable degree of fire retardancy may not be expressed. If it exceeds 80 mass %, the ease of handling tends to be sacrificed and moldability will be adversely affected. The more preferred range is not less than 5 mass % nor more than 50 mass %.

Referring to the fire retardant resin composition of the invention, its thermal softening temperature is preferably not less than 45° C. nor more than 200° C. The more preferred range is not less than 60° C. nor more than 150° C. Its hydroxyl equivalent value is preferably not less than 100 g/mol nor more than 280 g/mol. The more preferred range is not less than 120 g/mol nor more than 240 g/mol.

In using the fire retardant resin composition of the invention for the preparation of the curable fire retardant resin composition to be described hereinafter, it is sometimes preferably used as a solution, a varnish, or a paste. In such cases, it is both necessary to co-disperse the inorganic microfine particle and the polyphenol compound and to ensure satisfactory fluidity. In such application, the fire retardant resin composition preferably contains a compound having at least one structure selected from the group consisting of ether bond, ester bond, and nitrogen atom as a solvent, a plasticizer, or a lubricant.

As the above compound having an ether bond, the following compounds can be used with advantage: for example, diethyl ether, dipropyl ether, diisopropyl ether, dibutyl ether, dihexyl ether, ethyl vinyl ether, butyl vinyl ether, anisole, phenethol, butyl phenyl ether, pentyl phenyl ether, methoxytoluene, benzyl ethyl ether, diphenyl ether, dibenzyl ether, veratrole, propylene oxide, 1,2-epoxybutane, dioxane, trioxane, furan, 2-methylfuran, tetrahydrofuran, tetrahydropyran, cineole, 1,2-dimethoxyethane, 1,2-diethoxyethane, 1,2-dibutoxyethane, glycerin ethers, crown ethers, methylal, acetal, methyl cellosolve, ethyl cellosolve, butyl cellosolve, ethylene glycol monopropyl ether, ethylene glycol monohexyl ether, ethylene glycol dimethyl ether, diethylene glycol, diethylene glycol methyl ether, diethylene glycol ethyl ether, diethylene glycol butyl ether, diethylene glycol dimethyl ether, diethylene glycol diethyl ether, diethylene glycol dibutyl ether, triethylene glycol, triethylene glycol monomethyl ether, tetraethylene glycol, 1-methoxy-2-propanol, 1-ethoxy-2-propanol, propylene glycol methyl ether, propylene glycol dimethyl ether, propylene glycol propyl ether, propylene glycol butyl ether, dipropylene glycol, dipropylene glycol monomethyl ether, dipropylene glycol monoethyl ether, dipropylene glycol dimethyl ether, dipropylene glycol diethyl ether, dipropylene glycol dibutyl ether, tripropylene glycol, tripropylene glycol monomethyl ether, 2-methoxyethanol, 2-ethoxyethanol, 2-(methoxymethoxy)ethanol, 2-isopropoxyethanol, 2-butoxyethanol, 2-(isopentyloxy)ethanol, 2-(hexyloxy)ethanol, 2-phenoxyethanol, 2-(benzyloxy)ethanol, furfuryl alcohol, tetrahydrofurfuryl alcohol, etc.

As the above-mentioned compound having an ester bond, the following compounds are suitable: for example, methyl formate, ethyl formate, propyl formate, butyl formate, isobutyl formate, pentyl formate, methyl acetate, ethyl acetate, propyl acetate, isopropyl acetate, butyl acetate, isobutyl acetate, sec-butyl acetate, pentyl acetate, isopentyl acetate, 3-methoxybutyl acetate, sec-hexyl acetate, 2-ethylbutyl acetate, 2-ethylhexyl acetate, cyclohexyl acetate, benzyl acetate, methyl propionate, ethyl propionate, butyl propionate, isopentyl propionate, ethylene glycol monoacetate, diethylene glycol monoacetate, monoacetin, diacetin, triacetin, monobutyrin, dimethyl carbonate, diethyl carbonate, dipropyl carbonate, dibutyl carbonate, butyric esters, isobutyric esters, isovaleric esters, stearic esters, benzoic esters, ethyl cinnamates, abietic esters, adipic esters, γ-butyrolactones, oxalic esters, malonic esters, maleic esters, tartaric esters, citric esters, sebacic esters, phthalic esters, ethylene diacetate, etc.

As the above-mentioned compound containing a nitrogen atom, the following compounds are suitable: for example, nitromethane, nitroethane, 1-nitropropane, 2-nitropropane, nitrobenzene, acetonitrile, propionitrile, succinonitrile, butyronitrile, isobutyronitrile, valeronitrile, benzonitrile, α-tolunitrile, formamide, N-methylformamide, N,N-dimethlformamide, N,N-diethylformamide, acetamide, N-methylacetamide, N,N-dimethylacetamide, N,N-diethylacetamide, 2-pyrrolidone, N-methylpyrrolidone, ε-caprolactam, etc.

As the compound having a plurality of above-mentioned structures selected from the group consisting of ether bond, ester bond, and nitrogen atom, the following compounds are suitable: for example, N-ethylmorpholine, N-phenylmorpholine, methyl cellosolve acetate, ethyl cellosolve acetate, propyl cellosolve acetate, butyl cellosolve acetate, phenoxyethyl acetate, diethylene glycol monomethyl ether acetate, diethylene glycol monoethyl ether acetate, diethylene glycol monopropyl ether acetate, diethylene glycol monobutyl ether acetate, propylene glycol methyl ether acetate, propylene glycol ethyl ether acetate, propylene glycol propyl ether acetate, propylene glycol butyl ether acetate, dipropylene glycol methyl ether acetate, dipropylene glycol ethyl ether acetate, dipropylene glycol propyl ether acetate, dipropylene glycol butyl ether acetate, tripropylene glycol methyl ether acetate, etc.

The utilizing amount of the above compound having at least one structure selected from the group consisting of ether bond, ester bond, and nitrogen atom is preferably not less than 5 weight parts nor more than 1000 weight parts based on 100 weight parts of the resin composition. The more preferred range is not less than 10 weight parts nor more than 300 weight parts.

The fire retardant resin composition of the invention can be used, in admixture with a compound having at least two glycidyl groups and/or other additives, as a curable fire retardant resin composition e.g. semiconductor encapsulating materials or circuit or wiring board insulation materials. The curable fire retardant resin composition of the invention is a composition essentially comprising said polyphenol compound, said inorganic microfine particle, and said compound having at least two glycidyl groups, which can be obtained not only by the above-mentioned method with mixing a composition comprising said polyphenol compound and inorganic microfine particle with the compound having at least two glycidyl groups, but also by a method with mixing said polyphenol compound, said inorganic microfine particle, and said compound having at least two glycidyl groups in the same operation or a method which comprises mixing said polyphenol compound and a dispersion of said inorganic microfine particle in said compound having at least two glycidyl groups. Thus, the curable fire retardant resin composition such as semiconductor encapsulating materials, circuit or wiring board insulation materials and the like, which essentially comprises the fire retardant resin composition of the invention and the compound having at least two glycidyl groups is also another aspect of the present invention. Furthermore, a shaped article can be provided by curing said curable fire retardant resin composition. Therefore, the shaped article obtainable by curing the curable fire retardant resin composition of the invention, the semiconductor device obtainable by encapsulating and curing the semiconductor encapsulating materials of the invention, and the electric circuit or wiring board obtainable by curing the circuit or wiring board insulation material of the invention are also still further aspects of the present invention.

As the above-mentioned compound having at least two glycidyl groups, epoxy resins having an average of two or more glycidyl groups per molecule are suitable. Thus, epi-bis type glycidyl ether series of epoxy resins resulting from the condensation of a bisphenol compound, such as bisphenol A, bisphenol F, bisphenol S, or the like, with an epihalohydrin; novolak aralkyl type glycidyl ether series of epoxy resins resulting from the condensation of a phenolic compound, such as phenol, cresol, xylenol, resorcine, catechol, bisphenol A, bisphenol F, or the like, with formaldehyde, acetaldehyde, propionaldehyde, benzaldehyde, salicylaldehyde, dicyclopentadiene, a terpene, coumarin, p-xylylenedimethyl ether, dichloro-p-xylene, or the like, followed by further condensation of the resulting polyphenol compound with an epihalohydrin; glycidyl ester series of epoxy resins resulting from the condensation of tetrahydrophthalic acid, hexahydrophthalic acid or benzoic acid with an epihalohydrin; glycidyl ether series of epoxy resins resulting from the condensation of a hydrogenated bisphenol or a glycol with an epihalohydrin; amine-containing glycidyl ether series of epoxy resins resulting from the condensation of hydantoin or cyanuric acid with an epihalohydrin; and aromatic polycyclic epoxy resins such as biphenyl series of epoxy resin, naphthalene series of epoxy resin, and the like can be used with advantage. Moreover, compounds having an epoxy group in the molecular as obtainable by the addition reaction between such an epoxy resin as above and a polybasic acid compound and/or a bisphenol compound can also be employed. One or two or more species of these can be used.

The formulating mass ratio of said fire retardant resin composition and epoxy resin (fire retardant resin composition/epoxy resin) is preferably not less than 30/70 nor more than 70/30. If it is less than 30/70, the mechanical and other properties of the cured article may possibly deteriorate. If it exceeds 70/30, fire retardancy may possibly be insufficient. The more preferred range is not less than 35/65 nor more than 65/35.

The above-mentioned mixture may further contain other additives, such as curing accelerators, fillers, coupling agents, fire retardant additives, plasticizers, reactive diluents, and pigments.

Suitable examples of the above curing accelerator referred to just above are imidazole compounds such as 2-methylimidazole, 2-ethyl-4-methylimidazole, etc.; amines such as 2,4,6-tris(dimethylaminomethyl)phenol, benzylmethylamine, 1,8-diazabicylo[5.4.0]-7-undecene (DBU), 3-(3,4-dichlorophenyl)-1,1-dimethylurea (DCMU), etc.; and organophosphorus compounds such as tributylphosphine, triphenylphosphine, tris(dimethoxyphenyl)phosphine, and the like.

Furthermore, as pointed out above, the fire retardant resin composition in a fluid form, such as a solution, a varnish, or a paste, may be formulated with an epoxy resin to provide a curable fire retardant resin composition as an ink, a paint, or a varnish, for instance. In such cases, after using the curable fire retardant resin composition as an ink, a paint, or a varnish, the compound having at least one structure selected from the group consisting of ether bond, ester bond, and nitrogen atom can be removed by drying under reduced pressure and/or under heating to provide a shaped article comprising the fire retardant resin composition. The drying conditions for inks or paints can be appropriately adjusted according to the vapor pressure, boiling point, etc. of the used compound having at least one structure selected from the group consisting of ether bond, ester bond, and nitrogen atom. Furthermore, in cases where a varnish is used by immersion, the substrate to be immersed may for example be a fibrous reinforcement.

As the above reinforcement, any known reinforcement material can be used; thus inorganic fibrous materials such as woven and nonwoven fabrics of N type, NE type, S type, T type, D type and other glass fibers, quartz, etc. as well as organic materials can be mentioned. These may be such as glass roving, glass cloth, chopped glass strand, hollow glass fiber, glass mat, glass-surfaced mat, nonwoven glass cloth, ceramic webs (woven fabric etc.), and metal fiber webs. In addition, synthetic organic reinforcing fillers such as organic polymers capable of forming filaments can also be employed in the practice of the invention. As representative examples of the reinforcing organic fiber material, there can be mentioned poly(etherketones), polyimidobenzoxazole, poly(phenylene sulfide), polyesters, aromatic polyamides, aromatic polyimides, polyetherimides, acrylic resins, and poly(vinyl alcohol). Fluoropolymers such as polytetrafluoroethylene can also be used in the practice of the present invention. The reinforcement further includes natural organic fibers known to those skilled in the art, such as cotton cloth, linen cloth, felt, carbon cloth, natural cellulose webs such as kraft paper, cotton paper, etc., and glass fiber-reinforced paper. Such reinforcing fillers can be provided in the monofilament or multi-filament mode, and can be used each independently or in combination with other types of fiber, by co-weaving or in the core/shell, side-by-side, orange-type, or matrix-fibril, and other constructions known to those skilled in textile production. Such fillers can be supplied in various modes such as woven fiber-reinforcement, nonwoven fiber reinforcement, or paper.

The shaped article mentioned above preferably exhibits not less than V-2 grade of the fire retardancy according to the UL-94 fire retardancy test. By insuring a fire retardancy of not less than V-2 grade of the UL-94 fire retardancy, the fire retardancy required of molding materials for electronic components, adhesives and paints can be sufficiently satisfied.

The curable fire retardant resin composition of the invention can be used as a sealant such as a semiconductor encapsulating material. The application of the curable fire retardant resin composition of the invention as a encapsulating material is described in the following. In the curable fire retardant resin composition of the invention, an inorganic filler can be incorporated for reduction of humid absorption and linear expansion coefficient, enhancement of heat conductivity, and enhancement of strength. The inorganic filler includes powdery fillers such as fused silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite, titania, etc., beads as spheriform versions thereof, glass fibers, and so forth. Furthermore, as inorganic fillers having fire retardant effects, aluminum hydroxide, magnesium hydroxide, zinc borate, zinc molybdate, etc. can be mentioned. These inorganic fillers can be used each independently or in a combination of two or more species. Among the inorganic fillers mentioned above, fused silica is preferred for reducing the linear expansion coefficient and alumina is preferred because of its high heat conductivity. The morphology of the filler is preferably spheriform because of its molding flowability and abrasiveness of a mold. In terms of moldability, hygroscopicity, reduction of linear expansion coefficient and enhancement of strength, the formulating amount of the inorganic filler based on 100 weight parts of the curable fire retardant resin composition of the invention is preferably not less than 70 weight parts, more preferably 100 to 1000 weight parts, still more preferably 200 to 950 weight parts. If it is less than 70 weight parts, reflow resistance tends to be decreased. If it exceeds 950 weight parts, fluidity tends to be insufficient.

In the curable fire retardant resin composition of the invention, the hitherto-known non-halogen, non-antimony fire retardant additives can be concomitantly used. For example, nitrogen-containing compounds such as cyanuric acid derivatives, isocyanuric acid derivatives, etc., phosphorus/nitrogen-containing compounds such as cyclophosphazenes, and metal compounds such as zinc oxide, iron oxide, molybdenum oxide, ferrocene, etc. can be mentioned.

For the purpose of improving the moisture resistance and working stability at elevated-temperature of IC and other semiconductor devices, an anion exchanger can also be added. The anion exchanger is not particularly restricted but the hitherto-known substances can be used. For example, hydrotalcites and the hydrous oxide of an element selected from among magnesium, aluminum, titanium, zirconium, and bismuth can be mentioned, and these can be used each independently or in a combination of two or more species. Among these, hydrotalcites of the following general formula (3) are preferred:

$$Mg_{1-X}Al_X(OH)_2(CO_3)_{X/2} \cdot mH_2O \qquad (3)$$

wherein $0 < X \leq 0.5$; and m is a positive integer.

In the curable fire retardant resin composition of the invention, there may optionally be incorporated such other additives as a mold release, e.g. higher fatty acids, metal salts of higher fatty acids, ester type waxes, polyolefin type waxes, polyethylene, polyethylene oxide, etc., a colorant, e.g. carbon black etc., and a stress reliever, e.g. silicone oil, silicone rubber powder, etc.

For use of the curable fire retardant resin composition of the invention as a sealant, any technique can be used for preparation provided that the various raw materials can be uniformly dispersed and admixed; however, as a common practice, a method comprising thoroughly blending the predetermined formulating amounts of raw materials with a mixer or the like, melt-kneading the blend with a mixing roll, an extruder, or the like, and crushing the kneaded mass after cooling can be mentioned. Tableting size and mass contribute compatible to the molding conditions.

The electronic component obtainable by encapsulating devices with the curable fire retardant resin composition of the invention includes electronic components fabricated by mounting various devices, i.e. active devices such as semiconductor chips, transistors, diodes, thyristors, etc. and passive devices such as capacitors, resistors, coils, etc. on various supporting members such as lead frames, wired tape carriers, wiring boards, glass sheets, silicon wafers, etc. and sealing the necessary portions with the epoxy resin molding material for encapsulating according to the invention. As such electronic components, there can be mentioned ordinary resin-sealed ICs, such as DIP (dual inline package), PLCC (plastic leaded chip carrier), QFP (quad flat package), SOP (small outline package), SOJ (small outline J-lead package), TSOP (thin small outline package), TQFP (thin quad flat package), etc., which are obtainable by fixing semiconductor devices on a lead frame, connecting terminal means, such as the bonding pad, of the devices to the leads by wire bonding or by means of a vamp and encapsulating the assembly with the curable fire retardant resin composition of the invention by transfer molding or the similar technique; the TCP (tape carrier package) obtainable by sealing the semiconductor chips connected to a tape carrier through a vamp with the curable fire-retardant resin composition of the invention; the COB (chip on board) module, hybrid IC, or multi-chip module, which is obtainable by connecting active devices, such as semiconductor chips, transistors, diodes, thyristors, etc., and/or passive devices such as capacitors, resistors, coils, etc. to the conductors formed on a wiring board or glass substrate by wire bonding, flip chip bonding or soldering and sealing the assembly with the curable fire retardant resin composition of the invention; and BGA (ball grid array), CSP (chip size package) or the like which is obtainable by mounting devices on the surface of an organic substrate formed with terminal means for wiring board connection on the reverse side, connecting the devices to the conductors of the organic substrate through a vamp or by wire bonding, and sealing the assembly with the curable fire retardant resin composition of the invention.

Referring to the encapsulating method of devices with the curable fire retardant resin composition of the invention, low-pressure transfer molding is the most common method but injection molding or compression molding, for instance, may also be used.

The electrical wiring board can be obtained by preparing a wiring board insulation material from the curable fire-retardant resin composition of the invention, a solvent as needed, said cure accelerator, filler, fire retardant additive, etc., immersing a suitable reinforcement or coating a suitable substrate with it, drying the material to remove the solvent, and curing the resin. The electrical wiring board includes one-sided, double-sided, or multi-layered composite laminate board, a glass epoxy type laminate board, an aramid epoxy type laminate board, a metal base wiring board, a built-up type wiring board, etc.

The solvent mentioned above is preferably said compound containing at least one structure selected from the group consisting of ether bond, ester bond, and nitrogen atom, and in order that the optimum viscosity may be established for immersing or coating, or depending on the drying conditions to be used, such compounds can be used each independently or as a mixture of two or more species. As to the filler and fire retardant additive, the same substances as those mentioned above for the semiconductor encapsulating material can be employed.

As the reinforcement, any of the materials mentioned hereinbefore can be employed, but woven and nonwoven fabrics of glass fiber or polyaramid fiber are particularly suitable. These materials can be used each independently or in a combination of two or more species.

The curable fire retardant resin composition of the invention can be preferably used as a raw material for the production of epoxy resins, as a molding material for shaped articles such as architectural members, various housings, laminate boards, built-up type circuit boards, solder resists, sealants, semiconductor encapsulating materials, various castings, machine parts, electronic/electric parts, road vehicles, ships, aircraft, etc., or as a raw material for the production of adhesives or electrically insulating paints, for instance.

The present invention is further directed to a silica which has not more than 3.0 cal/g of exotherm per unit mass as determined by differential scanning calorimetry and/or differential thermal analysis at 100° C. to 400° C. in an air stream and has not less than 0.001 nor more than 2.0 of integral intensity ratio $A_{Q3}/A_{Q4}$ obtainable by resolution of a peak situated in range of $-120$ to $-80$ ppm in $^{29}$Si-DD/MAS-NMR analysis into the $Q^3$ silica component and $Q^4$ silica component.

The fire retardancy-imparting ability of the silica according to the invention can be evaluated by a method combining the determination of the exotherm by differential scanning calorimetry and/or differential thermal analysis under the defined conditions, with the determination of the integral intensity ratio $A_{Q3}/A_{Q4}$ of the defined components by $^{29}$Si-DD/MAS-NMR analysis. This evaluation method is useful for expediently evaluating the capacity of silica for imparting fire retardancy to the resin.

The present invention, therefore, is further directed to a method of evaluating the fire retardancy-imparting ability of silica for resins, which comprises combining the determination of the exotherm per unit mass by differential scanning calorimetry and/or differential thermal analysis at the range of 100° C. to 400° C. in an air stream, with the determination of the integral intensity ratio $A_{Q3}/A_{Q4}$ found by resolution (splitting) of the peak in the range of $-120$ to $-80$ ppm in the $^{29}$Si-DD/MAS-NMR analysis of silica into the $Q^3$ silica component and $Q^4$ silica component.

In the above determination of exotherm, the exotherm of a substance can be measured by differential scanning calorimetry (DSC) using a differential scanning calorimeter and/or differential thermal analysis (TG-DTA) using a thermobalance, and by measuring the change in mass of the substance in response to heat with the thermobalance (TG), the exotherm can be determined from this change in mass. In the practice of the invention, while the exotherm may be determined by whichever of differential scanning thermometry and differential thermal analysis using a thermobalance, the average of the exotherm value determined by differential scanning calorimetry and that determined by differential thermal analysis using a thermobalance may be used.

The above determination by differential scanning calorimetry and/or determination by differential thermal analysis is preferably carried out by increasing the temperature at a rate of 1° C./min to 20° C./min over the range of 25° C. to 600° C. in an atmosphere of dry air at a flow rate of 0.1 mL/min to 5 L/min. Moreover, the exotherm in the invention is preferably calculated by converting the value observed from 100° C. to 400° C. to the exotherm per unit mass of silica.

The $^{29}$Si-DD/MAS-NMR analysis for the determination of integral intensity ratio $A_{Q3}/A_{Q4}$ is a technique of NMR (nuclear magnetic resonance) spectrometric analysis of solids for silicon atom. This determination method comprises applying a single pulse to the nucleus to be observed and carrying out $^1$H decoupling only during uptake of the signal, and since there is no enhancement of signal intensity due to the nuclear overhauser effect, quantitative signals can be obtained.

The parameter settings of the $^{29}$Si-DD/MAS-NMR analysis may for example be as follows;

Nuclear magnetic resonance spectrometer: AVANCE400, manufactured by Bruker Japan
Nuclear species to be measured: $^{29}$Si (observation nuclear resonance frequency 79.487 MHz)
Measuring mode: DD-MAS (dipole decoupling/magic angle spinning)
Application pulse: 10-60° pulse
Repetition time: not less than 60 sec.
Number of scans: 200 to 10000 times
Spinning rate: 3 to 15 kHz
Observation temperature: 300 K
External standard: sodium 3-(trimethylsilyl)propane-1-sulfonate, 1.534 ppm The pulse to be applied can be adjusted within the above range according to the relaxation time of the nucleus to be measured, and the number of scans and spinning rate can be adjusted within the above respective ranges according to the sample rotor diameter to be used for measurement.

$A_{Q3}$ of said integral intensity ratio $A_{Q3}/A_{Q4}$ denotes the peak area value of the $Q^3$ silica component in which the number of $SiO_4$ clusters adjacent to a silicon atom is 3 and $A_{Q4}$ denotes the peak area value of the $Q^4$ silica component in which the number of $SiO_4$ clusters adjacent to a silicon atom is 4. $A_{Q3}/A_{Q4}$ represents a value calculated from the integrated respective peak areas as split by waveform separation. Under the above-mentioned measuring conditions, the peak showing the presence of $Q^4$ silica component has a peak top at −120 to −100 ppm, while the peak showing the presence of $Q^3$ silica component has a peak top at −100 to −90 ppm. For example, FIGS. 2 and 3 are the charts obtained by the $^{29}$Si-DD/MAS-NMR analysis of the silica. FIG. 2 shows peak tops observed around −108 ppm and −99 ppm. Thus the peak around −108 ppm is assigned to the $Q^4$ silica component and the peak around −99 ppm is assigned to the $Q^3$ silica component, and the integral intensity ratio $A_{Q3}/A_{Q4}$ can, therefore, be calculated from the integrated intensity values of the respective peaks. FIG. 3 shows a peak top around −108 ppm; this peak is, therefore, assumed to show the presence of $Q^4$ silica component and suggest the absence of the $Q^3$ silica component, and accordingly the integral intensity ratio is calculated to be $A_{Q3}/A_{Q4}=0$.

In the evaluation method according to the invention, the fire retardancy-imparting ability of the silica for the resin can be reasonably evaluated as being good when said exotherm is not more than 3.0 cal/g and said integral intensity ratio $A_{Q3}/A_{Q4}$ is not less than 0.001 nor more than 2.0. By evaluating the fire retardancy-imparting ability of silica according to the above criteria, it is easy to explore whether a silica has a satisfactory fire retardancy-imparting ability or not.

In cases where organic leaving groups are present on the surface as well as interiorly of the above silica, which organic leaving group may for example be alkoxyl, alkyl, phenyl, phenoxyl, and/or amino, these groups leave from the silica at elevated temperature with generating copious heat under exposure to air, which induces the generation of heat in the resin composition containing the silica. Therefore, the exotherm referred to above is derived from the combustion of such organic leaving groups present on the surface and/or interiorly of the silica and affect the fire retardancy-imparting ability of the silica for the resin composition. Furthermore, the fire retardancy-imparting ability of silica should be also explained as the silanol (—Si—OH) groups existing in the silica undergo dehydrative condensation at elevated temperature to liberate $H_2O$ and the exotherm and integral intensity ratio $A_{Q3}/A_{Q4}$ within the above-mentioned respective ranges suggest that the silica has a sufficient number of silanol groups to insure a satisfactory fire retardancy-imparting ability.

Thus, a silica such that said exotherm is not more than 3.0 cal/g and said integral intensity ratio $A_{Q3}/A_{Q4}$ is not less than 0.001 nor more than 2.0 as examined by the above method of evaluating the fire retardancy-imparting ability according to the invention has a very favorable fire retardancy-imparting ability for resins.

The method of producing the silica according to the invention advantageously comprises a hydrolysis step for hydrolyzing a hydrolyzable silane compound and a condensation step for condensing the hydrolysate obtained in said hydrolysis step, and preferably the temperature for these hydrolysis and condensation reactions is controlled within the range of 0° C. to 150° C.

As the above hydrolyzable silane compound, an alkoxide compound and/or a carboxylic acid salt compound are preferred.

The alkoxide compound and/or carboxylic acid salt compound referred to above is preferably a compound represented by the following general formula (1a):

$$\mathrm{Si(OR^2)_4} \quad (1a)$$

(wherein $R^2$ represents an alkyl group or an acyl group) and/or a compound represented by the following general formula (2a):

$$\mathrm{(R^3)_qSi(OR^2)_{4-q}} \quad (2a)$$

(wherein $R^2$ is as defined in general formula (1a); $R^3$ represents an organic group; q represents an integer of 1 to 3).

The hydrolysis reaction and condensation reaction of the above alkoxide compound and carboxylic acid salt compound, both of which are hydrolyzable silane compounds, are written as follows.

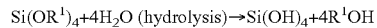

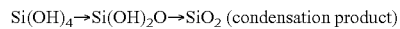

(wherein $R^1$ represents an alkyl group or an acyl group)

The alkyl group and acyl group as $R^2$ in the above general formulas (1a) and (2a) are preferably the same alkyl group and acyl group as those defined in the general formulas (1) and (2) relevant to the inorganic microfine particle described hereinbefore.

The organic group as $R^3$ in the above general formula (2a) is preferably the same organic group as defined for $R^3$ in the general formula (2) relevant to said inorganic microfine particle.

The above alkoxide compound and carboxylic acid salt compound, both of which are hydrolyzable silane compounds, are preferably the same as the alkoxide compound and carboxylic acid salt compound described for the inorganic microfine particle in the case where the metal element is Si. Such compounds may be used in one or two or more species. Preferred, among such compounds, are tetramethoxysilane, tetraethoxysilane, methyltrimethoxysilane, methyltriethoxysilane, dimethyldimethoxysilane, and dimethyldiethoxysilane.

In controlling said hydrolysis and condensation reactions, a metal chelate compound can be used for accelerating the reactions as similar to the description for said inorganic microfine particle, and as the metal chelate compound, the same compounds as those mentioned for said inorganic microfine particle can be preferably used.

The added amount of said metal chelate compound is preferably not more than 30 weight parts based on 100 weight parts of the above compound of general formula (1a) and/or compound of general formula (2a). If it exceeds 30 weight parts, molding of the resin intermixed with the compound may possibly give shaped articles with poor surface appearances. The more preferred added amount is not more than 20 weight parts and the still more preferred amount is not more than 10 weight parts.

The above alkoxide compound and carboxylic acid salt compound, which are described above as hydrolyzable silanes, as well as the silica obtainable by subjecting whichever of these compounds or both to hydrolysis and condensation may be formulated with colloidal silica and/or colloidal alumina just as mentioned for said inorganic microfine particle, and as the colloidal silica and colloidal alumina, those described for said inorganic microfine particle can be used with advantage.

The formulating amount of said colloidal silica and/or colloidal alumina may be the same as mentioned above for the inorganic microfine particle.

The silica according to the present invention has excellent fire retardancy-imparting ability and, therefore, a resin composition containing the above silica assumes an excellent fire retardancy.

As the resin component of said resin composition, the known resins can be used. Thus, for example, polyamide resins such as nylon 6, nylon 6,6, nylon 4,6, nylon 12, etc.; polyester resins such as poly(ethylene terephthalate), poly (butylene terephthalate), etc.; poly(vinyl chloride) resin, polyolefin resins, polyacetal resins, epoxy resins, acrylic resins, phenolic resins such as polyphenol compounds, ABS resin, AS resin, HIPS, and styrenic resins such as polystyrene, etc., can be used. However, when said resin composition is to be used as a molding material for electronic components or raw materials for adhesives or paints, for instance, it is preferable to use a polyphenol compound and/or an epoxy resin, because both are thermosetting and their cured formulations show excellent physical properties, heat resistance, and electrically insulating properties.

As the polyphenol compound referred to above, the same polyphenol compounds as those mentioned hereinbefore for the fire retardant resin composition can be used.

The above polyphenol compound is preferably has a structure such that aromatic units each having at least one phenolic hydroxyl group are connected to one another through an organic unit having two or more carbon atoms.

The epoxy resin suitable for use as the resin in said resin composition may be a compound having at least one epoxy group, thus including such preferred compounds as epi-bis type glycidyl ether series of epoxy resins resulting from the condensation of a bisphenol compound, such as bisphenol A, bisphenol S, bisphenol F, or the like, with an epihalohydrin; novolac aralkyl type glycidyl ether series of epoxy resins resulting from the condensation of a phenol compound, such as phenol, cresol, xylenenol, resorcine, catechol, bisphenol A, bisphenol F, naphthol, hydroquinone, or the like, with formaldehyde, acetaldehyde, propionaldehyde, benzaldehyde, salicylaldehyde, dicyclopentadiene, a terpene, coumarin, p-xylylenedimethyl ether, dichloro-p-xylene, or the like, and subsequent condensation of the resulting polyphenol compound with an epihalohydrin; glycidyl ester series of epoxy resins resulting from the condensation of tetrahydrophthalic acid, hexahydrophthalic acid, benzoic acid, or the like with an epihalohydrin; glycidyl ether series of epoxy resins resulting from the condensation of a hydrogenated bisphenol or a glycol with an epihalohydrin; and amine-containing glycidyl ether series of epoxy resins resulting from the condensation of hydantoin or cyanuric acid with an epihalohydrin. Moreover, compounds having an epoxy group in the molecular as obtainable by the addition reaction between such an epoxy resin as above and a polybasic acid compound and/or a bisphenol compound can also be employed.

The method of producing the above epoxy resin preferably comprises a polyfunctional glycidyl etherification of a polyphenol.

The glycidyl etherification referred to just above can be carried out by the known technique; for example, a polyphenol and an epihalohydrin are stirred together usually in presence of an alkali metal hydroxide at 40 to 120° C. for 5 to 24 hours and the reaction product is recovered.

As the alkali metal hydroxide referred to above, potassium hydroxide or sodium hydroxide, for instance, is suitable, and it is preferable to add the hydroxide gradually to a hot mixture of the polyphenol and epihalohydrin to control the reaction mixture at pH 6 to 10.

The above epihalohydrin is used in excess, namely in a proportion of 2 to 30 equivalents, preferably 2 to 10 equivalents, with respect to the hydroxyl groups of the polyphenol. After completion of the reaction, the residual epihalohydrin is removed by distillation under reduced pressure, or by azeotropic distillation with a suitable solvent, while the unreacted alkali metal compound and byproduct salt are preferably removed by, for example, washing with water. The glycidyl etherification can also be carried out by addition reaction between the epihalohydrin and the polyphenol in presence of a phase transfer catalyst, such as a quaternary ammonium salt or a phosphonium salt, generally at temperature of 40 to 120° C., followed by adding said alkali metal hydroxide to carry out ring-closing reaction generally at 40 to 120° C. The obtained epoxy resin preferably has 220 to 300 g/eq of an epoxy equivalent weight.

When the resin composition comprises a polyphenol compound as the resin component, the technology of producing the above resin composition includes, as described above, (1) the method which comprises producing said polyphenol compound and said silica independently, followed by mixing them, (2) the method which comprises producing said polyphenol compound in advance and subjecting said alkoxide compound and/or carboxylic acid salt compound, which are hydrolyzable silane compounds, to hydrolysis and condensation in a solution containing said polyphenol compound to disperse a silica therein, (3) the method which comprises subjecting the alkoxide compound and/or carboxylic acid salt compound to hydrolysis and condensation in a solution containing the above reactant material for the polyphenol compound to give a silica followed by forming said polyphenol compound to give a mixture, and the like, and among these methods, the method (2) or (3) is preferred.

In the above method (2) of producing the resin composition, the polyphenol compound is first produced as mentioned above and the solution containing this polyphenol compound is prepared. Then, the alkoxide compound and/or carboxylic acid salt compound and either water or a solvent containing water are added to the above solution to carry out hydrolysis and condensation.

The solution containing the above polyphenol compound is the same as the solution described hereinbefore for said fire retardant resin composition.

In the above method (3) of producing said resin composition, said alkoxide compound and/or carboxylic acid salt compound is subjected to hydrolysis and condensation in the solution containing the reactant material for the polyphenol compound to obtain a silica in the first place. Then, the reactant material for the polyphenol compound is caused to react in the solution containing the silica to synthesize the polyphenol compound to give the resin composition of the invention.

The above-mentioned solution preferably contains any of the following solvents; namely alcohols such as methanol, ethanol, etc.; ketones such as acetone, 2-butanone, etc.; and hydrophilic organic solvents such as tetrahydrofuran, N,N-dimethylformamide, pyridine, and so forth as well as the reactant material for the polyphenol compound. If necessary, other kinds of solvents may also be additionally used.

The resin composition obtained by the above production technology preferably has not less than 3 mass % nor more than 150 mass % of silica content based on 100 mass % of the resin composition. If it is less than 3 mass %, sufficient fire retardancy may not be expressed and if it exceeds 150 mass %, the ease of handling will be sacrificed and moldability adversely affected. The more preferred silica content is not less than 5 mass % nor more than 100 mass %.

The above resin composition can be caused to cure by an appropriate method selected according to the kind of resin used; thus, thermal curing by press-molding at elevated temperature, baking or the like is suitable, and when the resin composition comprising an epoxy resin as the resin component is to be cured, a curing agent for epoxy resins can be used.

The curing agent referred to above preferably includes amine compounds such as bis(4-aminophenyl)methane, aniline-formaldehyde resin, bis(4-aminophenyl)sulfone, propane-1,3-diamine, hexamethylenediamine, diethoxytriamine, triethylenetetramine, 2,2,4-trimethylhexamine-1,6- diamine, m-xylylenediamine, bis(4-aminocyclohexyl) methane, 3-aminomethyl-3,3,5-trimethylcyclohexylamine, isophoronediamine, etc.; aliphatic polyamines; polyaminoamides obtainable from any of these amines and a dimerized or trimerized fatty acid; polyphenol compounds obtainable by condensation of a phenol compound, such as phenol, cresol, xylenol, resorcine, catechol, bisphenol A, bisphenol F, etc., with formaldehyde, acetaldehyde, propionaldehyde, benzaldehyde, salicylaldehyde, dicyclopentadiene, terpene, coumarin, p-xylylenedimethyl ether, or the like; and acid anhydrides such as phthalic anhydride, tetrahydrophthalic anhydride, pyromellitic anhydride, 3,3,4,4-benzophenonetetracarboxylic dianhydride, etc. One or two or more species of these can be used.

The silica according to the invention and the resin composition containing said silica can be used with advantage in or as a molding material for architectural members, housings, laminate boards, built-up circuit boards, sealants, semiconductor encapsulating materials, cast products and molding materials to be used in machine parts, electronic/electric parts and components, road vehicles, ships, and aircraft or as a raw material for the production of adhesives, electrically insulating paints, and so forth.

BEST MODE FOR CARRYING OUT THE INVENTION

Figure 1:
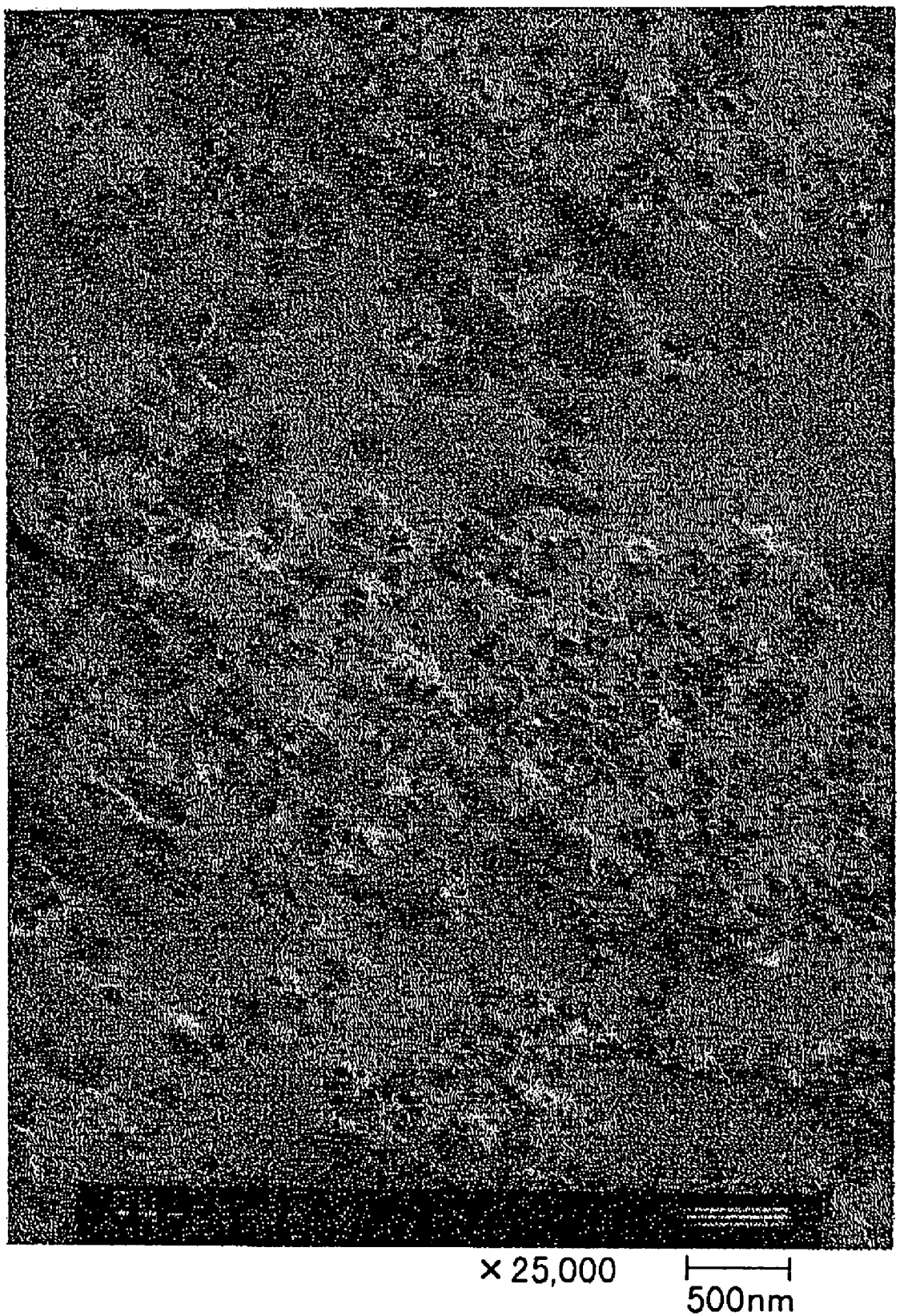
FIG. 1 is a TEM photograph of a fire retardant resin composition embodying the present invention.
Figure 2:
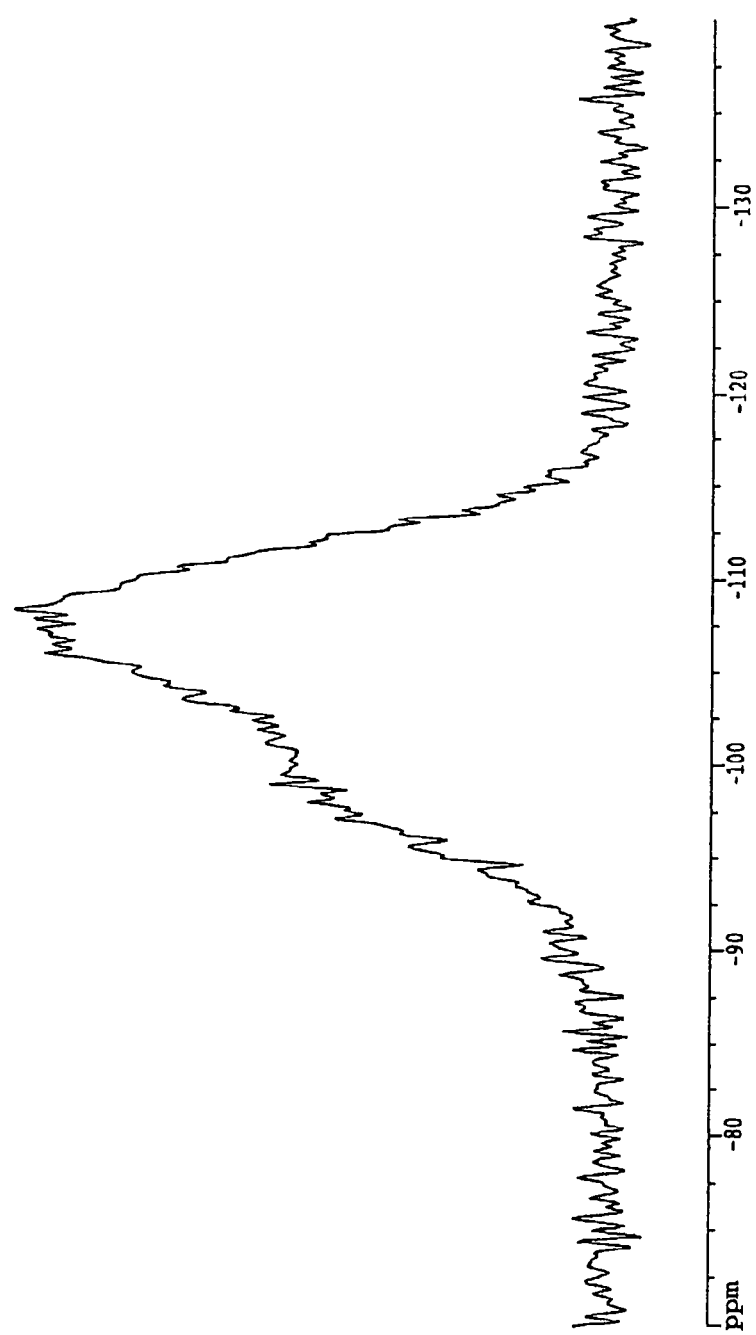
FIG. 2 is a $^{29}$Si-DD/MAS-NMR spectrometric chart of a silica.
Figure 3:
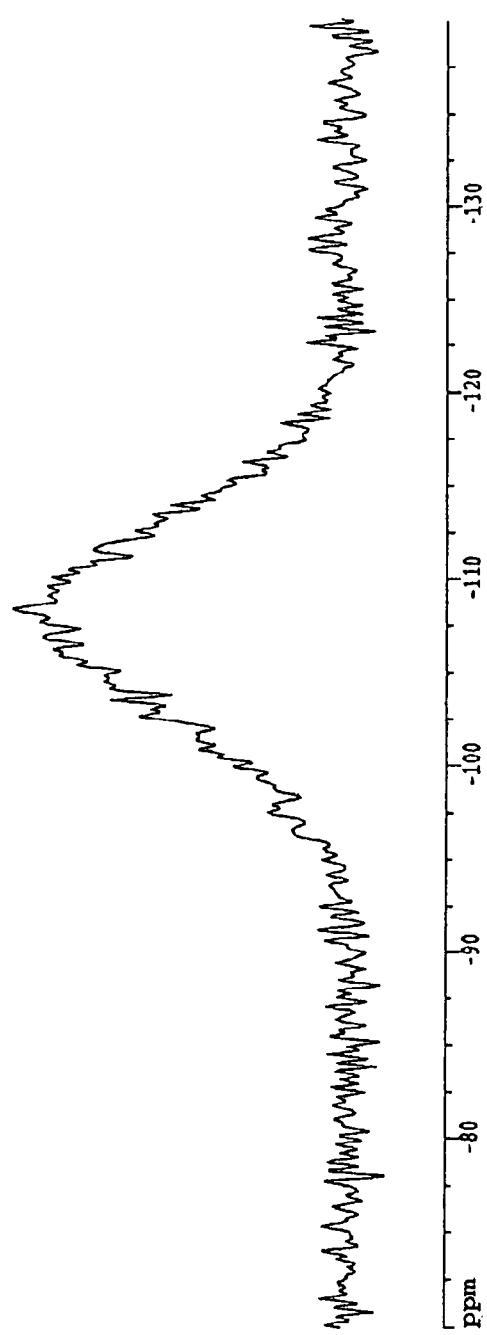
FIG. 3 is a $^{29}$Si-DD/MAS-NMR spectrometric chart of a silica.

The following examples illustrate the present invention in further detail without defining the scope of the invention. Unless otherwise indicated, all "parts" are "parts by weight" and all "percentages (%)" are "mass %".

The thermal softening temperature was measured with a thermomechanical analyzer (TMA) on a needle penetration mode and the hydroxyl value was determined in accordance with JIS K0070. The inorganic microfine particle content was determined by allowing the composition as synthesized to stand in an air stream of air at 800° C. for 30 minutes and calculating the content from the change in mass from the pre-standing value.

EXAMPLE 1

To a 2 L of four-necked flask equipped with a gas inlet, a Dean-Stark trap and a stirring rod was charged 302.6 g of p-xylene glycol, 687.0 g of phenol and 12.6 g of p-toluenesulfonic acid, and the temperature was increased in a nitrogen gas stream. While collecting the water which began to form around 115° C. with the trap, the temperature was increased to 150° C. and maintained for 6 hours. The formation of water ceased when 79 g of water was recovered. Then the reaction system was cooled to 60° C. and 176 g of methanol was added. Two PTFE tubes were inserted into the reaction mixture in the four-necked flask, and with the temperature being maintained at 60° C., 336.4 g of tetramethoxysilane and 157.8 g of water were fed through the respective tubes by means of peristaltic roller pumps over 4 hours. After the feeding, the reaction system was maintained at 60° C. for 4 hours. Then, under nitrogen stream, the temperature was increased again and while trapping the residual water and formed methanol with the trap, which had begun to be distilled off at about 80° C., the stirring was continued up to 180° C. The residual phenol was distilled off under reduced pressure and the system was cooled to give polyphenol composition A as a milk-white solid. The yield was 619 g, the thermal softening temperature was 52° C., the hydroxyl value was 193 g/mol, and the inorganic microfine particle content was 20.7%.

EXAMPLE 2

To a 1 L of four-necked flask equipped with a gas inlet, a Dean-Stark trap and a stirring rod was charged 432.9 g of phenol, 172.2 g of benzoguanamine and 179.2 g of 37% formalin, and while the white opaque solution was stirred in a nitrogen gas stream, 9 ml of aqueous ammonia solution was added dropwise. When the reaction system had become transparent, the temperature was increased to about 80° C. and the system was incubated under stirring for 4 hours. The temperature of the reaction mixture was increased again. With water which began to be distilled off at about 100° C. being collected with the trap, the solution was heated and maintained at 180° C. for 4 hours. The formation of water ceased when 160 g of water was recovered. Therefore, the reaction mixture was cooled to 60° C. and 100 g of methanol and 8.3 g of acetic acid were added. Then, two PTFE tubes were inserted into the reaction mixture in the four-necked flask, and with the temperature being maintained at 60° C., 210.1 g of tetramethoxysilane and 99.4 g of water were fed through the respective tubes by means of peristaltic roller pumps over 4 hours. After the feeding, the reaction system was incubated at 60° C. for 4 hours. The reaction solution was started heating again under nitrogen stream and while the residual water and formed methanol which had begun to be distilled off at about 80° C. were trapped with the trap, the stirring was continued up to 180° C. The residual phenol was then distilled off under reduced pressure and the system was cooled to give polyphenol composition B as a milk-white solid. The yield was 486 g, the thermal softening temperature was 98° C., the hydroxyl value was 204 g/ml, and the inorganic microfine particle content was 16.5%.

The polyphenol composition B thus obtained was observed by transmission electron microscopy (TEM). FIG. 1 showing the TEM photograph of polyphenol composition B indicates a microfine dispersion of silica in the form of discrete spherical particles or aggregates thereof with particle diameters ranging from about 50 nm to about 500 nm.

EXAMPLE 3

To a 2 L of four-necked flask equipped with a gas inlet, a Dean-Stark trap and a stirring rod was charged 492.2 g of 4,4'-diacetoxymethylbiphenyl, 517.6 g of phenol and 25.1 g of strong acid ion exchange resin (product name "Amberlyst 15 Dry", product of Rohm & Haas Co.), and the increase of temperature was started under nitrogen stream. Acetic acid began to form around 140° C. and while trapping this acetic acid with the trap, the reaction solution was heated to 170° C. and maintained for 8 hours. The reaction ceased when 195 g of acetic acid was recovered. Therefore, the reaction mixture was cooled and the ion exchange resin was recovered by filtration. To the filtrate was added 109.0 g of methanol, and the mixture was returned to the flask. Then, two PTFE tubes were inserted into the reaction mixture in the four-necked flask, and with the temperature being maintained at 60° C., 251.2 g of tetramethoxysilane and 142.0 g of 15% aqueous ammonia solution were fed through the respective tubes by means of peristaltic roller pumps over 4 hours. After this feeding, the system was incubated at 60° C. for 4 hours. The solution was heated again under nitrogen and while trapping the residual water and formed methanol which had begun to be distilled off at about 80° C., the stirring was continued up to 180° C. The residual phenol was then distilled off under reduced pressure and the residue was cooled to give polyphenol composition C as a milk-white solid. The yield was 521 g, the thermal softening temperature was 76° C., the hydroxyl value was 235 g/mol, and the inorganic microfine particle content was 19.2%.

EXAMPLE 4

To a 1 L of four-necked flask equipped with a gas inlet, a Dean-Stark trap and a stirring rod was charged 469.1 g of 2,6-diacetoxymethylnaphthalene, 536.4 g of phenol and 24.7 g of strong acid ion exchange resin (product name "Amberlyst 15 Dry", product of Rohm & Haas Co.), and the temperature was increased under nitrogen. Acetic acid began to form around 140° C. and collected with the trap, the solution was heated and maintained at 170° C. for 8 hours. The reaction ceased when 202 g of acetic acid was recovered and, therefore, the reaction system was cooled and the ion exchange resin was recovered by filtration. To the filtrate was added 137.1 g of methanol, and the mixture was returned to the flask. Then, two PTFE tubes were inserted into the reaction mixture in the four-necked flask, and with the temperature being maintained at 60° C., 260.3 g of tetramethoxysilane and 104.7 g of 15% aqueous ammonia solution were fed through the respective tubes by means of peristaltic roller pumps over 4 hours. After this feeding, the system was incubated at 60° C. for 4 hours. The increase of temperature was started again under nitrogen stream and while trapping the residual water and formed methanol which had begun to be distilled off at about 80° C., the stirring was continued up to 180° C. The residual phenol was then distilled off under reduced pressure and the system was cooled to give polyphenol composition D as a milk-white solid. The yield was 508 g, the thermal softening temperature was 73° C., the hydroxyl value was 219 g/mol, and the inorganic microfine particle content was 20.0%.

EXAMPLE 5

To a 1 L of four-necked flask equipped with a gas inlet, a Dean-Stark trap and a stirring rod was charged 433.0 g of phenol and 12.1 g of triethylamine, and while the temperature was maintained at 45° C., 210.1 g of tetramethoxysilane and 99.4 g of water were fed through independent tubes by means of peristaltic roller pumps over 4 hours. After the feeding, the reaction mixture was stirred at 60° C. for 4 hours. Then, 30.2 g of benzoguanamine, 60.9 g of melamine and 179.2 g of 37% formalin were added, and the white opaque solution was continuously stirred under nitrogen at 60° C. The reaction system became transparent in 2 hours. The solution was heated to 80° C., maintained for 4 hours under constant stirring, and started heating again. While collecting the methanol-water mixture which had begun to be distilled off at about 85° C. with the trap, the reaction mixture was heated and maintained at 180° C. for 4 hours. The reaction ceased when 350 g of the mixture was recovered. Therefore, the residual phenol was distilled off under reduced pressure and the reaction mixture was cooled to give polyphenol composition E as a milk-white solid. The yield was 345 g, the thermal softening temperature was 150° C., the hydroxyl value was 185 g/mol, and the inorganic microfine particle content was 23.2%.

EXAMPLE 6

To a 500 mL of four-necked flask equipped with a gas inlet, a Dean-Stark trap, and a stirring rod was charged 208.92 g of phenol and stirred at 40° C. under nitrogen stream. Then, two PTFE tubes were inserted into the reaction mixture in the four-necked flask and with the temperature being maintained at 60° C., 101.38 g of tetramethoxysilane and 56.5 g of 15% aqueous ammonia solution were fed through the respective tubes by means of roller pumps over 4 hours. After the feeding, the reaction mixture was incubated at 60° C. for 4 hours. Then, 16.62 g of benzoguanamine, 33.60 g of melamine and 87.21 g of 37% formalin were fed and the mixture was consistently stirred at 60° C. until the reaction mixture became transparent. Thereafter, the reaction system was started heating again and while trapping the water-methanol mixture which had begun to be distilled off at about 85° C., the solution was heated and maintained at 180° C. for 4 hours. When the recovery of water-methanol mixture had reached 180 g, the residual phenol was distilled off under reduced pressure and the reaction system was cooled to give polyphenol composition F as a milk-white solid. The yield was 200 g, the thermal softening temperature was 122° C., the hydroxyl value was 193 g/mol, and the inorganic microfine particle content was 21.7%.

COMPARATIVE EXAMPLE 1

Omitting the hydrolysis and condensation of tetramethoxysilane following recovery of 79 g of water in the procedure of Example 1, the residual phenol was distilled off under reduced pressure at 180° C. and the reaction mixture was cooled to give polyphenol composition G as a brown-colored solid. The yield was 487 g, the thermal softening temperature was 48° C., the hydroxyl value was 152 g/mol, and the inorganic microfine particle content was 0%.

COMPARATIVE EXAMPLE 2

Omitting the hydrolysis and condensation of tetramethoxysilane following recovery of 160 g of water in the procedure of Example 2, the residual phenol was distilled off under reduced pressure at 180° C. and the reaction mixture was cooled to give polyphenol composition H as a deep yellow solid. The yield was 417 g, the thermal softening temperature was 92° C., the hydroxyl value was 171 g/mol, and the inorganic microfine particle content was 0%.

EXAMPLE OF PREPARATION OF A SHAPED ARTICLE-1

EXAMPLES 7 TO 12 AND COMPARATIVE EXAMPLES 3 AND 4

In a heating batch mixer of 300 g capacity, a phenol-novolak series of epoxy resin ("Araldite EPN-1180", 180 g/mol of epoxy equivalent weight, product of Ciba Specialty Chemicals Co.) was formulated with each of said polyphenol compositions A to H in the ratio indicated in Table 1. After each batch was thoroughly dissolved and blended for 30 minutes at 110° C. under reduced pressure, the curing accelerator 2-ethyl-4-methylimidazole was fed in the proportion indicated in Table 1. The mixture was kneaded under reduced pressure for 30 seconds, followed by immediate injection into a flat board molding die and press-shaped at 180° C. under 3.92 MPa for 1 hour. The molding was postcured by allowing it to stand for 2 hours at 180° C. in a nitrogen stream at atmospheric pressure to give a cured article. The mechanical and thermal properties of the cured article were evaluated according to JIS K6911 and JIS K7121, respectively. The fire retardancy of this cured article was evaluated in accordance with the UL-94 test method.

TABLE 1

| | | Example | | | | | | Comparative Example | |
|---|---|---|---|---|---|---|---|---|---|
| | | 7 | 8 | 9 | 10 | 11 | 12 | 3 | 4 |
| Composition (parts by weight) | EPN-1180 | 48.3 | 46.9 | 43.4 | 45.1 | 49.3 | 48.2 | 54.2 | 51.3 |
| | Polyphenol composition A | 51.7 | — | — | — | — | — | — | — |
| | Polyphenol composition B | — | 53.1 | — | — | — | — | — | — |
| | Polyphenol composition C | — | — | 56.6 | — | — | — | — | — |
| | Polyphenol composition D | — | — | — | 54.9 | — | — | — | — |
| | Polyphenol composition E | — | — | — | — | 50.7 | — | — | — |
| | Polyphenol composition F | — | — | — | — | — | 51.8 | — | — |
| | Polyphenol composition G | — | — | — | — | — | — | 45.8 | — |
| | Polyphenol composition H | — | — | — | — | — | — | — | 48.7 |
| | 2E4MZ | 1.0 | 1.0 | 1.0 | 1.0 | 1.0 | 1.0 | 1.0 | 1.0 |
| Physical properties | Flexural strength/MPa | 103 | 125 | 118 | 130 | 110 | 100 | 79 | 109 |
| | Flexural elastic modulus/GPa | 4.58 | 4.58 | 4.20 | 4.79 | 4.80 | 4.28 | 3.62 | 4.06 |
| | Fracture toughness/MPa·m$^{1/2}$ | 0.77 | 0.75 | 0.86 | 0.67 | 0.75 | 0.81 | 0.75 | 0.71 |
| | Tg(TMA)/° C. | 130 | 129 | 125 | 133 | 143 | 130 | 130 | 129 |
| UL-94 fire retardancy | Average flame-out time/sec | 3.8 | 1.0 | 2.2 | 1.5 | 0.8 | 1.2 | Combusted | 58 |
| | Evaluation | V-0 | V-0 | V-0 | V-0 | V-0 | V-0 | — | V-1 |

The abbreviations used in Table 1 have the following meanings.

"EPN-1180" means phenol-novolak series of epoxy resin ("Araldite EPN-1180", 180 g/mol of epoxy equivalent weight, product of Ciba Specialty Chemicals Co.) and "2E4MZ" means 2-ethyl-4-methylimidazole.

EXAMPLE OF PREPARATION OF A SHAPED ARTICLE-2

EXAMPLES 13 TO 18 AND COMPARATIVE EXAMPLES 5 AND 6

In a heating batch mixer of 300 g capacity, phenol-novolak series of epoxy resin ("Araldite EPN-1180", 180 g/mol of epoxy equivalent weight, product of Ciba Specialty Chemicals Co.), methyl cellosolve and one of said polyphenol compositions A to H were formulated in the ratio indicated in Table 2 and thoroughly dissolved at 80° C. and blended for 30 minutes, followed by cooling to room temperature. Then, the curing accelerator 2-ethyl-4-methylimidazole was fed in the proportion indicated in Table 2 to prepare a varnish. This varnish was used to immerse a glass woven cloth (0.18 mm thick, product of Nitto Boseki Co., Ltd.) at a rate of 80 weight parts as solids of varnish per 100 weight parts of the cloth and dried in a drying oven at 120° C. for 30 minutes and in a drying oven at 150° C. for 1 minute to prepare a prepreg. Six sheets of said prepreg were laid up and a 35 μm-thick electrolytic copper foil was applied on both sides of the stack. The assembly was then hot press-formed under the conditions of 3923 kPa at 190° C. for 120 minutes to give a 1.2 mm-thick double-side copper-clad laminate sheet. The fire retardancy of this copper-clad laminate sheet was evaluated according to the UL-94 test method and the solder heat resistance, peel strength, and dielectric constant were evaluated according to JIS C6481.

TABLE 2

| | | Example | | | | | | Comparative Example | |
|---|---|---|---|---|---|---|---|---|---|
| | | 13 | 14 | 15 | 16 | 17 | 18 | 5 | 6 |
| Composition (parts by weight) | EPN-1180 | 33.8 | 32.8 | 30.4 | 31.6 | 34.5 | 33.7 | 38.0 | 35.9 |
| | Polyphenol composition A | 36.2 | — | — | — | — | — | — | — |
| | Polyphenol composition B | — | 37.2 | — | — | — | — | — | — |
| | Polyphenol composition C | — | — | 39.6 | — | — | — | — | — |
| | Polyphenol composition D | — | — | — | 38.4 | — | — | — | — |
| | Polyphenol composition E | — | — | — | — | 35.5 | — | — | — |
| | Polyphenol composition F | — | — | — | — | — | 36.3 | — | — |
| | Polyphenol composition G | — | — | — | — | — | — | 32.0 | — |
| | Polyphenol composition H | — | — | — | — | — | — | — | 34.1 |
| | 2E4MZ | 1.0 | 1.0 | 1.0 | 1.0 | 1.0 | 1.0 | 1.0 | 1.0 |
| | Methyl cellosolve | 30.0 | 30.0 | 30.0 | 30.0 | 30.0 | 30.0 | 30.0 | 30.0 |
| Physical properties | 280° C. solder heat resistance time/sec | 180 or more | 180 or more | 180 or more | 180 or more | 180 or more | 180 or more | 115 | 63 |
| | Peel strength | 2.0 | 1.8 | 2.3 | 1.6 | 1.8 | 1.8 | 1.4 | 1.3 |
| | Dielectric constant (1 MHz) | 3.2 | 2.6 | 3.0 | 2.4 | 3.1 | 3.2 | 4.0 | 3.8 |
| UL-94 fire retardancy | Average flame-out time/sec | 4.3 | 1.8 | 2.8 | 2.0 | 1.2 | 2.2 | Combusted | Combusted |
| | Evaluation | V-0 | V-0 | V-0 | V-0 | V-0 | V-0 | — | — |

In Table 2, "EPN-1180" and "2E4MZ" have the same meanings as in Table 1.

(Results)

Various characteristic values of the cured articles are shown in Table 1 and various characteristic values of the copper-clad laminate sheets are shown in Table 2. No practically useful fire retardancy was exhibited at the low level of addition even though commercial fused silica was used as the inorganic microfine particle in the Comparative Examples. However, in the Examples where the inorganic microfine particle was synthesized by the hydrolysis and condensation of a metal alkoxide, a practically useful fire retardancy was expressed with the low level of addition. Furthermore, there was no decrease in mechanical strength or thermal behaviors that could be attributed to the presence of the inorganic microfine particle synthesized by the hydrolysis and condensation of a metal alkoxide and the corresponding copper-clad laminates were also found to exhibit satisfactory characteristics.

EXAMPLES 19 AND 20

In a heating batch mixer of 300 g capacity, cresol-novolak series of epoxy resin (product name "ESCN-220HH", 220 g/mol of epoxy equivalent weight, product of Sumitomo Chemical Company, Ltd.), the polyphenol composition A or B obtained in Examples, propylene glycol methyl ether acetate, solvent naphtha and a mixture of heavy aromatic petrolerium were formulated in the ratio indicated in Table 3 and thoroughly dissolved at 80° C. After cooling to room temperature, triphenylphosphine, as the curing accelerator, was added and dissolved in the proportion indicated in Table 3 to prepare an ink. The ink thus prepared was applied to one side of a 16 μm-thick copper foil by screen printing and dried in an oven at 100° C. for 10 minutes. The other side of the foil was also subjected to coating and drying under the same conditions as above and was cured in an oven at 180° C. for 30 minutes to give a cured film. The boiling water resistance of the cured film obtained was tested by 2-hour boiling in water and 30-second immersion in a solder bath at 280° C. and rated for the change in appearance according to the criteria: ○=no change in appearance, x=blister/peel. As to thermal behavior, the dynamic modulus of viscoelasticity (DMA) was determined.

TABLE 3

|  |  | Example 19 | Example 20 |
|---|---|---|---|
| Composition (parts by weight) | ESCN-220HH | 33.8 | 32.8 |
|  | Polyphenol composition A | 36.2 | — |
|  | Polyphenol composition B | — | 37.2 |
|  | TPP | 1.0 | 1.0 |
|  | PGMAc | 15.0 | 15.0 |
|  | Solvent naphtha | 15.0 | 15.0 |
| Physical properties | Boiling water resistance | ○ | ○ |
|  | Tg(DMA) | 140 | 145 |

In Table 3, "EPN-1180" has the same meaning as in Table 1. "PGMAc" means propylene glycol methyl ether acetate and TPP means triphenylphosphine. The numerical values relating to composition are in parts by weight and Tg in the section of physical properties is in units of ° C.

(Results)

Various physical properties of cured films are presented in Table 3. It was found that the cured thin film demonstrated their excellent thermal property and also the satisfactory boiling water resistance.

EXAMPLE 21 TO 26

Bisphenol F series of epoxy resin (product name "YDF 170", 170 g/mol of epoxy equivalent weight, product of Tohto Kasei K.K.), biphenyl series of epoxy resin (product name "YX-4000H", 195 g/mol of epoxy equivalent weight, product of Japan Epoxy Resins Co., Ltd.), cresol-novolak series of epoxy resin (product name "ESCN-220HH", 220 g/ml of epoxy equivalent weight, product of Sumitomo Chemical Company, Ltd.), polyphenol A or B obtained in Examples, triphenylphosphine, fused silica (product name "PLR-6", mean particle diameter: 4.1 μm, product of Tatsumori Co.), carnauba wax (product name "M-300", product of Cerarica Noda Co., Ltd.) and carbon black (product name "MA-100", product of Mitsubishi Chemical Corporation) were formulated in the ratio indicated in Table 4 and roll-kneaded at 80° C. for 10 min. to prepare a molding compound. Using a transfer press, the compound was cured under the conditions of 180° C. and 6.9 MPa for 90 seconds and postcured in an oven at 180° C. for 5 hours to give a cured resin shaped article. The Tg of the shaped article was measured with a thermomechanical analyzer (TMA) and, in addition, a pressure cooker was performed to carried out a humidification test under the conditions of 121° C. and 0.20 MPa for 100 hours for investigating the rate of mass gain.

TABLE 4

|  |  | Example 21 | Example 22 | Example 23 | Example 24 | Example 25 | Example 26 |
|---|---|---|---|---|---|---|---|
| Composition (parts by weight) | YDF-170 | 100 | 100 | — | — | — | — |
|  | YX-4000H | — | — | 100 | 100 | — | — |
|  | ESCN-220HH | — | — | — | — | 100 | 100 |
|  | Polyphenol composition A | 113 | — | 99 | — | 88 | — |
|  | Polyphenol composition B | — | 120 | — | 105 | — | 92 |
|  | Fused silica | 1980 | 2043 | 1510 | 1554 | 362 | 369 |
|  | TPP | 2.0 | 2.0 | 2.0 | 2.0 | 2.0 | 2.0 |
|  | Carnauba wax | 2.0 | 2.0 | 2.0 | 2.0 | 2.0 | 2.0 |
|  | Carbon black | 3.0 | 3.0 | 3.0 | 3.0 | 3.0 | 3.0 |
| Physical properties | Tg(TMA) | 113 | 101 | 120 | 115 | 143 | 141 |
|  | Change of mass after humidification (%) | 0.08 | 0.04 | 0.01 | 0.01 | 0.05 | 0.07 |

In Table 4, "TPP" has the same meaning as in Table 3. Tg in the physical properties section is in units of ° C.

(Results)

Various physical characteristic values of the cured films are presented in Table 4. Despite the, formulations of the shaped article containing fused silica as a dominant component, the respective shaped articles showed 100° C. or more of Tg, which indicated excellent heat resistances, and considerably low hygroscopicity.

PRODUCTION EXAMPLE 1

Polyphenol composition A was obtained by the same procedure as in Example 1. The yield was 619 g, the thermal softening temperature was 52° C., the hydroxyl value was 193 g/mol, and the inorganic microfine particle content was 20.7%.

PRODUCTION EXAMPLE 2

Polyphenol composition B was obtained by the same procedure as in Example 2. The yield was 486 g, the thermal softening temperature was 98° C., the hydroxyl value was 204 g/mol, and the inorganic microfine particle content was 16.5%.

PRODUCTION EXAMPLE 3

To a 2 L of four-necked flask equipped with a gas inlet, a Dean-Stark trap and a stirring rod was charged 109.0 g of methanol. Then, two PTFE tubes were inserted into the methanol in the four-necked flask and, with the temperature being maintained at room temperature, 251.2 g of tetramethoxysilane and 142.0 g of 15% aqueous ammonia solution were fed through the respective tubes by means of peristaltic roller pumps over 4 hours. After the feeding, the system was incubated at 60° C. for 4 hours. Then, 421 g of melamine-phenol resin (product name "Epicure YLH969", hydroxyl value: 148 g/ml, softening point: 118° C., nitrogen content: 15%, product of Japan Epoxy Resins Co., Ltd.) was added to the reaction system and dissolved at 60° C. Then, the temperature was increased under nitrogen stream. Methanol began to be distilled off around 65° C. and the solution of methanol and water was collected with the trap, stirring was continued up to 180° C. and the residual phenol was distilled off under reduced pressure. After cooled to room temperature, polyphenol composition I as a milk-white solid was obtained. The yield was 521 g, the thermal softening temperature was 123° C., the hydroxyl value was 183 g/mol, and the inorganic microfine particle content was 19.2%.

PRODUCTION EXAMPLE 4

To a 1 L of four-necked flask equipped with a gas inlet, a Dean-Stark trap and a stirring rod was charged 109.0 g of methanol. Then, two PTFE tubes were inserted into the methanol in the four-necked flask, and 251.2 g of tetramethoxysilane and 142.0 g of 15% aqueous ammonia solution were fed through the respective tubes by means of peristaltic roller pumps at room temperature over 4 hours. After the feeding, the system was incubated at 60° C. for 4 hours. After the reaction mixture was cooled to room temperature, white powder was filtered out with a membrane filtering paper with 0.2 μm average of micropore and baked at 600° C. in an air stream for 2 hours. After cooling to room temperature, the powder was crushed in an agate mortar. The resulting powder was added to 421 g of a molten melamine-phenol resin (product name "Epicure YLH969", hydroxyl value: 148 g/mol, softening point: 118° C., nitrogen content: 15%, product of Japan Epoxy Resins Co., Ltd.) at 150° C. in a 1 L of four-necked flask equipped with a gas inlet and stirring rod. After cooling, polyphenol composition J was obtained as a milk-white solid. The yield was 518 g, the thermal softening temperature was 123° C., the hydroxyl value was 183 g/mol, and the inorganic microfine particle content was 19.0%.

PRODUCTION EXAMPLE 5

Except that the added amount of water for hydrolysis of tetramethoxysilane was reduced to 45.0 g, the procedure of Production Example 2 was otherwise repeated to give polyphenol composition K as a milk-white solid. The yield was 493 g, the thermal softening temperature was 98° C., the hydroxyl value was 204 g/mol, and the inorganic microfine particle content was 16.0%.

PRODUCTION EXAMPLE 6

421 g of molten melamine-phenol resin (product name "Epicure YLH969", hydroxyl value 148 g/mol, softening point: 118° C., nitrogen content: 15%, product of Japan Epoxy Resins Co., Ltd.) was placed in a four-necked 1 L flask equipped with a gas inlet and a stirring rod at 150° C. was added 99.1 g of commercial fused silica (product name "PLR-6", mean particle diameter 4.1 μm, product of Tatsumori Co.), and the mixture was cooled to give polyphenol composition L as a milk-white solid. The yield was 518 g, the thermal softening temperature was 123° C., the hydroxyl value was 183 g/mol, and the inorganic microfine particle content was 19.0%.

EXAMPLE OF EVALUATION OF THE SILICA IN THE POLYPHENOL COMPOSITION

The above polyphenol compositions A, B and I to L were respectively placed in screw-capped bottles containing tetrahydrofuran and stirred with a shaker for 2 hours to give white opaque solutions. Each of these solutions was centrifuged and allowed to stand for one day, whereby an insoluble fraction was allowed to settle. The supernatant only was removed and the residual slurry was added with tetrahydrofuran again. This procedure was repeated for 3 times successively and the final slurry was filtered through membrane filtering paper with 0.025 μm average of micropore to isolate the powdered silica from each polyphenol composition.

With the silica thus recovered, the peak exotherm between 100° C. and 400° C. was measured with DSC (DSC-3100, manufactured by Mac Science Co.). The measuring conditions were: temperature increasing rate: 10° C./min, measuring temperature range: 25 to 600° C., measuring atmosphere: dry air, flow rate: 150 mL/min.

In addition, the $^{29}$Si-DD/MAS-NMR spectrum of the silica solid was measured using Bruker's AVANCE400. The measuring conditions were: measured nucleus: $^{29}$Si (observation resonance frequency 79.487 MHz), measuring mode: DD/MAS (dipole-decoupling method), application pulse: 20 to 45 degree, repetition time: 60 sec., number of scans: 200 to 5000, spinning rate: 3 to 10 kHz, observation temperature 300 K. The peak observed with sodium 3-(trimethylsilyl)propane-1-sulfonate as an external standard was set to 1.534 ppm. The peak appearing over the range of −110 ppm to −80 ppm was subjected to waveform separation to extract a $Q^3$ silica component and a $Q^4$ silica component and the integral intensity ratio $A_{Q3}/A_{Q4}$ was calculated from the respective integrated intensity values.

EXAMPLE OF EVALUATION OF THE POLYPHENOL COMPOSITION

Each of the above polyphenol compositions A, B and I to L was mixed with liquid bisphenol F epoxy resin (product name "YDF-170", epoxy equivalent 169.5 g/mol, product of Tohto Kasei K.K.) and triphenylphosphine in the ratio indicated in Table 1 and the mixture was batch-kneaded at 110° C. to prepare a homogeneous mixture. This batch was transferred to a flat metal board mold and press-formed under the conditions of 180° C. and 0.98 MPa for 2 hrs to give a cured article in the form of a flat board. The fire retardancy of the cured article was evaluated by the UL-94 test method.

(Results)

The results of analysis of isolated silica are presented in Table 1. The results of analysis of the silicas isolated from polyphenol compositions A, B, and I are shown under Examples 27 to 29 and the results of analysis of the silicas from polyphenol compositions J to L are shown under Comparative Examples 7 to 9.

In Examples 27 to 29, $A_{Q3}/A_{Q4}$ is not less than 0.001 and the exothermic peak between 100° C. and 400° C. is minimal, suggesting the abundance of silanol groups in the silicas. In Comparative Examples 7 and 9, $A_{Q3}/A_{Q4}$ is invariably 0 and the exothermic peak between 100° C. and 400° C. is minimal, suggesting the complete absence of silanol groups in the silicas. In Comparative Example 8, $A_{Q3}/A_{Q4}$ is comparatively large and the exothermic peak between 100° C. and 400° C. is also large, suggesting the presence of an abundance of combustible organic groups other than silanol in the silica.

The fire retardancy data on the above cured articles are presented in Table 5. The fire retardancy values of cured articles prepared by polyphenol compositions A, B, and I are shown under Examples 27 to 29 and the fire retardancy values of cured articles prepared by polyphenol compositions J to L are shown under Comparative Examples 7 to 9.

Whereas the UL-94 fire retardancy of V-0 was expressed in Examples 27 to 29, the fire retardancy was not achieved to the grade V-0 in Comparative Examples 7 to 9. These results are correlated with the degree of presence of silanol groups in silica which is suggested in Table 5. The above results indicate that the evaluation of fire retardancy due to addition of silica can be easily predicted from the intensity ratio of $Q^3$ peak to $Q^4$ peak confirmed by in $^{29}$Si-DD/MAS-NMR spectrometry of silica and the exotherm between 100° C. and 400° C. in DSC analysis.

eliminate the adverse effects to the environment and human physiology but also very satisfactory in fundamental characteristics such as physical properties and heat resistance. Moreover, it is capable of providing cured articles with excellent fire retardancy.

The present application claims priority under 35 U.S.C. § 119 to Japanese Patent Application No.2002-151271, filed May 24, 2002, entitled "FIRE RETARDANT RESIN COMPOSITION, METHOD OF ITS PRODUCTION, AND SHAPED ARTICLE COMPRISING THE SAME". The content of this application is incorporated herein by reference in its entirety.

The invention claimed is:

1. A fire retardant resin composition comprising a polyphenol compound and an inorganic microfine particle, wherein said polyphenol compound has such a structure that aromatic units each having at least one phenolic hydroxyl group are connected to one another through an organic unit containing two or more carbon atoms, wherein said organic trait containing two or more carbon atoms has a cyclic structure, and said inorganic microfine particle is a product of hydrolysis and condensation of an alkoxide compound and/or a carboxylic acid salt compound, wherein said microfine particle is a silica having not less than 0.001 nor more than 2.0 of an integral intensity ratio $A_Q{}^3/A_Q{}^4$ obtainable by splitting a peak situated in the range of −120 to −80 ppm in $_{29}$Si-DD/MAS-NMR spectrometry into a $Q^3$ silica component and a $Q^4$ silica component and has not more than 3.0 cal/g of exotherm per unit mass thereof as observed in differential scanning calorimetry and/or differential thermal analysis in an air stream at 100° C. to 400° C.

2. The fire retardant resin composition according to claim 1 wherein said organic unit containing two or more carbon atoms has a triazine ring and/or an aromatic ring.

3. The fire retardant resin composition according to claim 1 wherein said alkoxide compound contains a silicon alkoxide.

4. The fire retardant resin composition according to claim 1 wherein said inorganic microfine particle comprises a discrete spherical particle and/or aggregates thereof with its average particle diameter as aggregate being not more than 100 μm.

5. The fire retardant resin composition according to claim 1 which contains a compound having at least one structure selected from the group consisting of ether bond, ester bond, and nitrogen atom.

TABLE 5

| | | Example 27 | Example 28 | Example 29 | Comparative Example 7 | Comparative Example 8 | Comparative Example 9 |
|---|---|---|---|---|---|---|---|
| Composition of cured article | YDF-170 | 46.8 | 45.4 | 48.1 | 48.1 | 45.4 | 48.1 |
| | Polyphenol composition A | 53.2 | — | — | — | — | — |
| | Polyphenol composition B | — | 54.6 | — | — | — | — |
| | Polyphenol composition I | — | — | 51.9 | — | — | — |
| | Polyphenol composition J | — | — | — | 51.9 | — | — |
| | Polyphenol composition K | — | — | — | — | 54.6 | — |
| | Polyphenol composition L | — | — | — | — | — | 51.9 |
| | Triphenyl phosphine | 1.0 | 1.0 | 1.0 | 1.0 | 1.0 | 1.0 |
| DSC analysis of silica | Exotherm/cal/g | 1.2 | 2.4 | 0.8 | No exotherm | 13.7 | No exotherm |
| $^{29}$Si-NMR analysis of silica | $A_{Q3}/A_{Q4}$ | 0.29 | 0.45 | 0.43 | No $Q^3$ component | 0.37 | No $Q^3$ component |
| UL-94 fire retardancy of cured article | Average flame-out time/sec | 38 | 10 | 15 | 125 | Combusted | 93 |
| | Evaluation | V-0 | V-0 | V-0 | V-1 | — | V-1 |

In Table 5, "YDF-170" means liquid bisphenol F series of epoxy resin (product name, epoxy equivalent: 169.5 g/mol, product of Tohto Kasei K.K.).

INDUSTRIAL APPLICABILITY

The fire retardant resin composition of the invention, which is constituted as above, is not only halogen-free and, hence, 6. A method of producing the fire retardant resin composition according to claim 1,
which comprises a step of subjecting hydrolysis and condensation of an alkoxide compound and/or a carboxylic acid salt compound in a solution containing a reactant material for the polyphenol compound.

7. A curable fire retardant resin composition comprising, as essential components, the fire retardant resin composition according to claim 1 and a compound having at least two glycidyl groups.

8. A semiconductor encapsulating material comprising, as essential components, the fire retardant resin composition according to claim 1 and a compound having at least two glycidyl groups.

9. A wiring board insulation material comprising, as essential components, the fire retardant resin composition according to claim 1 and a compound having at least two glycidyl groups.

10. A shaped article obtainable by curing the curable fire retardant resin composition according to claim 7.

11. A semiconductor device obtainable by sealing with, and curing of, the semiconductor encapsulating material according to claim 8.

12. An electric wiring board obtainable by curing of the wiring board insulation material according to claim 9.

13. The fire retardant resin composition according to claim 2 wherein said alkoxide compound contains a silicon alkoxide.

14. The fire retardant resin composition according to claim 1, wherein said polyphenol compound is produced from a reactant material comprising a compound for constructing an aromatic unit having at least one phenolic hydroxyl group and a compound for constructing an organic unit containing two or more carbon atoms, and
said compound for constructing an organic unit containing two or more carbon atoms is at least one compound selected from the group consisting of (1) aromatic compounds having any of α-hydroxyalkyl, α-alkoxyalkyl and α-acetoxyalkyl groups, (2) unsaturated bond-containing compounds, and (3) compounds having any of amino, hydroxyalkylamino, and di(hydroxyalkyl)amino groups.

15. The fire retardant resin composition according to claim 14, wherein said compound for constructing an organic unit containing two or more carbon atoms is at least one compound selected from the group consisting of compounds having a xylylene moiety, compounds having a biphenylene moiety, compounds having a dicyclopentadiene moiety, and compounds having a triazine moiety.

16. The fire retardant resin composition according to claim 14, wherein said compound for constructing an organic unit containing two or more carbon atoms is at least one compound selected from the group consisting of compounds having a dicyclopentadiene moiety, and compounds having a triazine moiety.

17. The fire retardant resin composition according to claim 14, wherein said compound for constructing an organic unit containing two or more carbon atoms is a compound having a triazine moiety.

18. The fire retardant resin composition according to claim 1, wherein said inorganic microfine particle comprises discrete spherical particles and/or aggregates thereof, and the average particle diameter is not more than 2 μm.

19. The fire retardant resin composition according to claim 1, wherein the content of said inorganic microfine particle relative to 100 mass % of the fire retardant resin composition is not less than 3 mass % nor more than 50 mass %.

20. A method of producing a fire retardant resin composition comprising a polyphenol compound and an inorganic microfine particle, which comprises a step of subjecting hydrolysis and condensation of an alkoxide compound and/or a carboxylic acid salt in a solution containing a polyphenol compound having such a structure that aromatic units each having at least one phenolic hydroxyl group are connected to one another through an organic unit containing two or more carbon atoms: wherein said step of subjecting hydrolysis and condensation of an alkoxide compound and/or a carboxylic acid salt compound provides a silica having not less than 0.001 nor more than 2.0 of an integral intensity ratio $A_Q^3 A_Q^4$ obtainable by splitting a peak situated in the range of −120 to −80 ppm in $_{29}$Si-DD/MAS-NMR spectrometry into a $Q^3$ silica component and a $Q^4$ silica component and has not more than 3.0 cal/g of exotherm per unit mass thereof as observed in differential scanning calorimetry and/or differential thermal analysis in an air stream at 100° C. to 400° C.

\* \* \* \* \*

UNITED STATES PATENT AND TRADEMARK OFFICE
CERTIFICATE OF CORRECTION

PATENT NO. : 7,601,775 B2  Page 1 of 1
APPLICATION NO. : 10/516695
DATED : October 13, 2009
INVENTOR(S) : Takuo Sugioka et al.

It is certified that error appears in the above-identified patent and that said Letters Patent is hereby corrected as shown below:

** In the Claims:

Claim 1, column 36, line 20, please amend "trait" to read "unit"

Claim 1, column 36, line 31, please amend "100° C." to read "100° C"

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,601,775 B2  Page 1 of 1
APPLICATION NO. : 10/516695
DATED : October 13, 2009
INVENTOR(S) : Takuo Sugioka et al.

It is certified that error appears in the above-identified patent and that said Letters Patent is hereby corrected as shown below:

Claim 20, column 38, line 28, please amend "a carboxylic acid salt" to read "a carboxylic acid salt compound"; and Claim 20, column 38, line 41, please amend "100° C. to 400° C." to read "100° C to 400° C."

Signed and Sealed this

Tenth Day of August, 2010

David J. Kappos
*Director of the United States Patent and Trademark Office*